(12) United States Patent
Kohara et al.

(10) Patent No.: US 9,496,287 B2
(45) Date of Patent: Nov. 15, 2016

(54) SEMICONDUCTOR DEVICE AND PRODUCTION METHOD THEREFOR

(71) Applicant: Sharp Kabushiki Kaisha, Osaka-shi, Osaka (JP)

(72) Inventors: Yasuhiro Kohara, Osaka (JP); Mitsunori Harada, Osaka (JP); Hijiri Nakahara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 72 days.

(21) Appl. No.: 14/417,887

(22) PCT Filed: Jul. 29, 2013

(86) PCT No.: PCT/JP2013/070448
§ 371 (c)(1),
(2) Date: Jan. 28, 2015

(87) PCT Pub. No.: WO2014/021252
PCT Pub. Date: Feb. 6, 2014

(65) Prior Publication Data
US 2015/0162348 A1     Jun. 11, 2015

(30) Foreign Application Priority Data
Aug. 2, 2012   (JP) ................................ 2012-172217

(51) Int. Cl.
*H01L 27/12*      (2006.01)
*G02F 1/1362*    (2006.01)
*H01L 21/768*    (2006.01)

(52) U.S. Cl.
CPC ....... *H01L 27/124* (2013.01); *G02F 1/136227* (2013.01); *H01L 27/1225* (2013.01); *H01L 27/1288* (2013.01); *H01L 21/7685* (2013.01)

(58) Field of Classification Search
None
See application file for complete search history.

(56) References Cited

U.S. PATENT DOCUMENTS

| 6,529,251 B2* | 3/2003 | Hibino ............. G02F 1/136227 257/59 |
|---|---|---|
| 2007/0252145 A1 | 11/2007 | Toyota et al. |
| 2007/0298538 A1 | 12/2007 | Tanabe et al. |
| 2011/0084280 A1 | 4/2011 | Nakayama et al. |
| 2012/0138938 A1 | 6/2012 | Bae et al. |
| 2012/0182274 A1 | 7/2012 | Nakahara |

FOREIGN PATENT DOCUMENTS

| JP | 07-120790 A | 5/1995 |
|---|---|---|
| JP | 2000-206508 A | 7/2000 |
| JP | 2007-298649 A | 11/2007 |
| JP | 2007-328210 A | 12/2007 |
| JP | 2012-118531 A | 6/2012 |
| WO | 2009/128424 A1 | 10/2009 |

OTHER PUBLICATIONS

Official Communication issued in International Patent Application No. PCT/JP2013/070448, mailed on Oct. 15, 2013.

* cited by examiner

*Primary Examiner* — Michelle Mandala
(74) *Attorney, Agent, or Firm* — Keating & Bennett, LLP

(57) ABSTRACT

This semiconductor device (100A) includes: a transparent conductive layer (3); an insulating layer (5) which is formed to cover the transparent conductive layer (3) and which has a hole (5*u*) that overlaps at least partially with the transparent conductive layer (3); a metal layer (7*d*) formed on the insulating layer (5) and inside the hole (5*u*); and a contact portion (90) connecting the transparent conductive layer (3) and the metal layer (7*d*) together. In the contact portion (90), a refractory metal nitride layer (20) is arranged between the transparent conductive layer (3) and a portion of the metal layer (7*d*) which is located inside the hole (5*u*). The refractory metal nitride layer (20) is in contact with the upper surface of the transparent conductive layer (3).

15 Claims, 22 Drawing Sheets

(a)

(b)

(c)

(d)

(a)

(b)

(c)

(d)

(e)

(f)

(g)

(a)

(b)

(c)

(d)

(e)

(a)

(b)

(c)

(d)

(e)

(f)

(a)

(b)

(a)

(b)

(a)

(b)

(c)

(d)

SEMICONDUCTOR DEVICE AND PRODUCTION METHOD THEREFOR

TECHNICAL FIELD

The present invention relates to a semiconductor device and a method for fabricating the device.

BACKGROUND ART

An active-matrix substrate for use in a liquid crystal display device and other devices includes switching elements such as thin-film transistors (which will be hereinafter referred to as "TFTs"), each of which is provided for an associated one of pixels. As such switching elements, a TFT which uses an amorphous silicon film as its active layer (and will be hereinafter referred to as an "amorphous silicon TFT") and a TFT which uses a polysilicon film as its active layer (and will be hereinafter referred to as a "polysilicon TFT") have been used extensively. Recently, people have proposed that an oxide semiconductor be used as a material for the active layer of a TFT instead of amorphous silicon or polysilicon. Such a TFT will be hereinafter referred to as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film, and therefore, is applicable to even a device that needs to cover a large area.

On an active-matrix substrate for use in a display device, a TFT is provided for each pixel and functions as a switching element. Each TFT has its drain electrode connected to a pixel electrode. For example, Patent Document No. 1 discloses an active-matrix substrate for use in an IPS (in-plain switching) liquid crystal display device. In the active-matrix substrate disclosed in Patent Document No. 1, a pixel electrode and a TFT's drain electrode are connected together inside a contact hole cut through an interlayer insulating layer.

CITATION LIST

Patent Literature

Patent Document No. 1: Japanese Laid-Open Patent Publication No. 2007-328210

SUMMARY OF INVENTION

Technical Problem

As described above, in a semiconductor device such as an active-matrix substrate including TFTs (i.e., a TFT substrate), a contact portion is provided to connect a transparent conductive layer which forms part of a pixel electrode and other members and a metal layer which forms part of a drain electrode and other members.

The present inventors discovered via experiments that in a contact portion between the transparent conductive layer and the metal layer, the contact resistance could increase or the degree of close contact could decrease depending on the structure of the contact portion and the materials of the respective layers. This is a discovery that the present inventors made while studying various configurations for an active-matrix substrate and other semiconductor devices as will be described in detail later.

If the contact portion had increased resistance, the intended performance could not be achieved. Also, if the degree of close contact between the metal layer and the transparent conductive layer decreased in the contact portion, the reliability of the semiconductor device could not be maintained.

Thus, to overcome these problems, an object of an embodiment of the present invention is to check such an increase in resistance and such a decrease in the degree of close contact in a contact portion of a semiconductor device in which a transparent conductive layer and a metal layer contact with each other.

Solution to Problem

A semiconductor device according to an embodiment of the present invention includes: a substrate; a transparent conductive layer supported by the substrate; an insulating layer which is formed to cover the transparent conductive layer and which has a hole that overlaps at least partially with the transparent conductive layer; a metal layer formed on the insulating layer and inside the hole; and a contact portion connecting the transparent conductive layer and the metal layer together. In the contact portion, a refractory metal nitride layer is arranged between the transparent conductive layer and a portion of the metal layer which is located inside the hole. The refractory metal nitride layer is in contact with the upper surface of the transparent conductive layer.

In one embodiment, when viewed along a normal to the substrate, the refractory metal nitride layer and the metal layer have mutually different shapes.

In one embodiment, the refractory metal nitride layer is in contact with the portion of the metal layer that is located inside the hole.

In one embodiment, the semiconductor device further includes a thin-film transistor supported by the substrate. The thin-film transistor includes a semiconductor layer with a channel region, a gate electrode, a gate insulating layer formed between the gate electrode and the semiconductor layer, and source and drain electrodes electrically connected to the semiconductor layer. The metal layer is either the drain electrode of the thin-film transistor or an electrode layer electrically connected to the drain electrode. The insulating layer includes the gate insulating layer. And the transparent conductive layer functions as a pixel electrode.

In one embodiment, the gate electrode includes a first gate layer formed out of the same metal nitride film as the refractory metal nitride layer.

In one embodiment, the gate electrode further includes a second gate layer which is arranged on the first gate layer and which is made of a different material from the first gate layer.

In one embodiment, the semiconductor device further includes, between the refractory metal nitride layer and the metal layer, a conductive layer formed out of the same conductive film as the second gate layer.

In one embodiment, the semiconductor device further includes another insulating layer between: the gate electrode; and the transparent conductive layer and the insulating layer.

In one embodiment, the semiconductor device includes an undercoat insulating layer between: the substrate; and the gate electrode and the transparent conductive layer.

In one embodiment, at least a portion of the upper surface of the nitride layer is in contact with the insulating layer.

A semiconductor device according to another embodiment of the present invention includes: a substrate; a transparent conductive layer supported by the substrate; a metal layer formed on the transparent conductive layer; and a contact portion connecting the transparent conductive layer and the metal layer together. In the contact portion, a refractory metal nitride layer is arranged between the transparent conductive layer and the metal layer. The refractory metal nitride layer is in contact with the upper surface of the transparent conductive layer. When viewed along a normal to the substrate, the refractory metal nitride layer is arranged in a region where the metal layer and the transparent conductive layer overlap with each other, and has a different shape from the metal layer.

In one embodiment, when viewed along a normal to the substrate, the refractory metal nitride layer is arranged over the entire region where the metal layer and the transparent conductive layer overlap with each other.

In one embodiment, the semiconductor device further includes a thin-film transistor supported by the substrate. The thin-film transistor includes a semiconductor layer with a channel region, a gate electrode, a gate insulating layer formed between the gate electrode and the semiconductor layer, and source and drain electrodes electrically connected to the semiconductor layer. The metal layer and the transparent conductive layer are arranged on the gate insulating layer. The metal layer is either the drain electrode of the thin-film transistor or an electrode layer electrically connected to the drain electrode. The transparent conductive layer functions as a pixel electrode.

In one embodiment, the semiconductor device further includes: a protective layer formed over the source and drain electrodes; and a common electrode arranged to overlap at least partially with the transparent conductive layer with the protective layer interposed between them.

In one embodiment, the semiconductor layer is an oxide semiconductor layer.

In one embodiment, the oxide semiconductor layer includes In, Ga and Zn.

In one embodiment, the oxide semiconductor layer has crystallinity.

A semiconductor device fabricating method according to an embodiment of the present invention is a method for fabricating a semiconductor device according to any of the embodiments described above. After the transparent conductive layer has been formed on the substrate and before the gate electrode and the insulating layer are formed, the nitride layer is formed.

A method for fabricating a semiconductor device according to another embodiment of the present invention includes the steps of: (a) providing a substrate; (b) forming a transparent conductive layer on a portion of the surface of the substrate; (c) forming a metal nitride film of a refractory metal nitride and a conductive film of a different material from the metal nitride film in this order over the surface of the substrate and over the transparent conductive layer; (d) patterning the metal nitride film and the conductive film by half-tone exposure process using a single photomask, thereby forming a gate electrode out of the metal nitride film and the conductive film on a rest of the surface of the substrate which is not covered with the transparent conductive layer and also forming a nitride layer out of the metal nitride film on the transparent conductive layer; (e) forming an insulating layer which covers the gate electrode, the transparent conductive layer and the nitride layer and which has a hole that exposes the surface of the nitride layer at least partially; (f) forming a semiconductor layer over the insulating layer; (g) forming a metal film over the semiconductor layer and the insulating layer and inside the hole; and (h) forming source and drain electrodes by patterning the metal film so that the drain electrode contacts with the nitride layer inside the hole.

A method for fabricating a semiconductor device according to still another embodiment of the present invention includes the steps of: (a) providing a substrate; (b) forming a gate electrode on a portion of the surface of the substrate and forming a semiconductor layer over the gate electrode with a gate insulating layer interposed between them; (c) forming a transparent conductive film and a metal nitride film of a refractory metal nitride over the gate insulating layer and the semiconductor layer; (d) patterning the transparent conductive film and the metal nitride film by half-tone exposure process using a single photomask, thereby forming a transparent conductive layer out of the transparent conductive film on a rest of the surface of the substrate which is not covered with the gate electrode and also forming a nitride layer out of the metal nitride film on a portion of the transparent conductive layer; (e) forming a metal film to cover the semiconductor layer, the transparent conductive layer and the nitride layer; and (f) forming source and drain electrodes by patterning the metal film so that the drain electrode contacts with the nitride layer.

In one embodiment, the semiconductor layer is an oxide semiconductor layer.

In one embodiment, the oxide semiconductor layer includes In, Ga and Zn.

In one embodiment, the oxide semiconductor layer has crystallinity.

Advantageous Effects of Invention

According to an embodiment of the present invention, in a contact portion which connects together a transparent conductive layer and a metal layer that has been formed on the transparent conductive layer, a refractory metal nitride layer is interposed between the transparent conductive layer and metal layer so as to contact with the upper surface of the transparent conductive layer. As a result, the resistance between the transparent conductive layer and the metal layer can be reduced to a low level. In addition, a decline in performance or reliability due to a low degree of close contact between the metal layer and the transparent conductive layer can be reduced, too.

DESCRIPTION OF EMBODIMENTS

Figure 1:
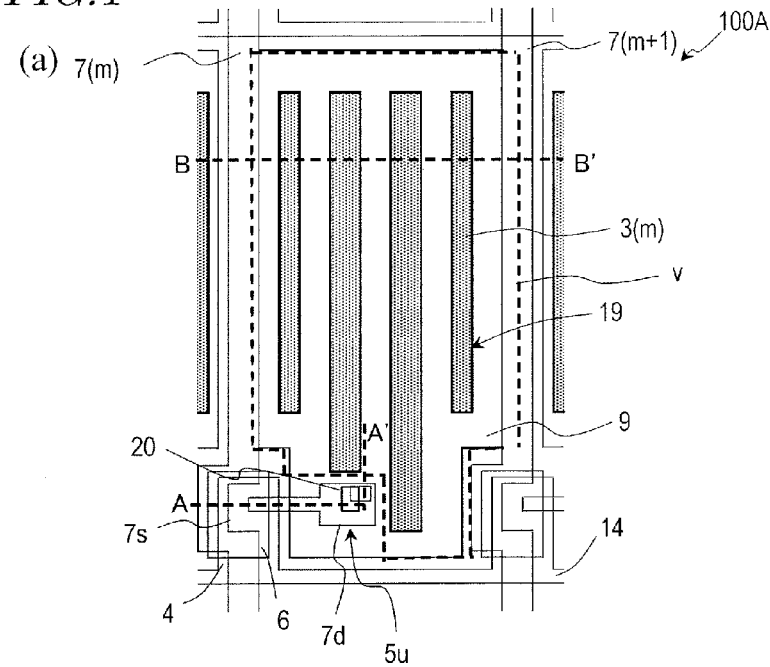
FIG. 1 (*a*) is a schematic plan view of a TFT substrate 100A according to a first embodiment of the present invention. (*b*) and (*c*) are schematic cross-sectional views of the TFT substrate 100A as respectively viewed on the planes A-A' and B-B' shown in (*a*). And (*d*) is an enlarged cross-sectional view of a contact portion.
Figure 1:
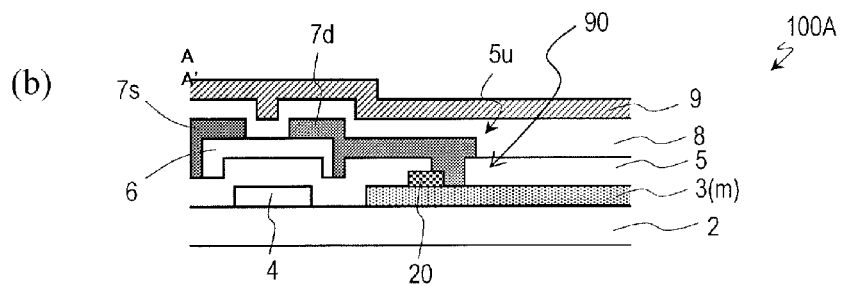
Figure 1:
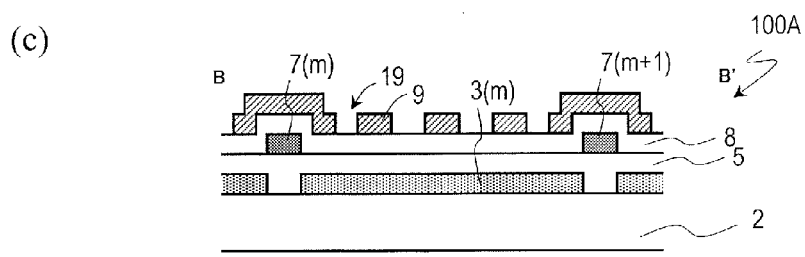
Figure 1:
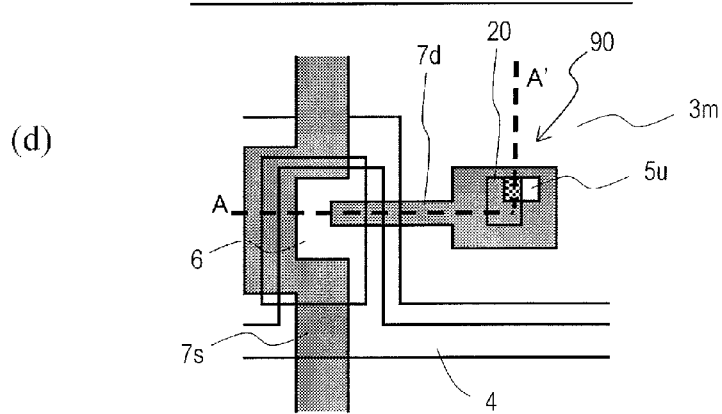

The present inventors studied an active-matrix substrate with a configuration in which a transparent conductive layer functioning as a pixel electrode was arranged lower than a TFT's drain electrode. As a result, the present inventors discovered that the contact resistance increased, or the degree of close contact decreased, between the transparent conductive layer and a metal layer to be the drain electrode, which is a problem. The present inventors also discovered that the same problem could also arise in not only a contact portion between the pixel electrode and the drain electrode but also a contact portion in which the transparent conductive layer was connected to an overlying metal layer such as an electrode or a line.

Meanwhile, in a contact portion in which a transparent conductive layer was arranged over a metal layer, the increase in contact resistance and the decrease in the degree of close contact were not so significant. That is why the problem described above would have been caused due to the property at the surface of the transparent conductive layer.

The present inventors also discovered that the problem was particularly remarkable in a configuration in which the metal layer and the transparent conductive layer were brought into contact with each other inside a contact hole cut through an insulating layer. This is probably because the property at the upper surface of the transparent conductive layer sometimes could deteriorate significantly by cutting a contact hole through it.

On top of that, not just in the process of cutting a contact hole but also in the semiconductor device manufacturing process in general, various kinds of processes to be performed after the transparent conductive layer had been formed altered the property at the surface of the transparent conductive layer and tended to make the contact resistance with respect to the metal layer even more non-stabilized.

Such a problem would arise in a contact portion in which the transparent conductive layer is arranged lower than the metal layer (i.e., closer to the substrate), and has never been recognized by anybody in the art.

The present inventors carried out intensive researches to overcome such a problem. As a result, the present inventors discovered that the increase in contact resistance and decrease in the degree of close contact would be checked by arranging a refractory metal nitride layer between the transparent conductive layer and the metal layer, thus perfecting our invention.

Embodiment 1

A semiconductor device as a first embodiment of the present invention will now be described with reference to the accompanying drawings. The semiconductor device of this embodiment includes an oxide semiconductor TFT. It should be noted that the semiconductor device of this embodiment just needs to include an oxide semiconductor TFT and is broadly applicable to an active-matrix substrate and various kinds of display devices and electronic devices.

A semiconductor device according to an embodiment of the present invention includes a contact portion to electrically connect a transparent conductive layer to a metal layer which is formed over the transparent conductive layer.

Figure 22:
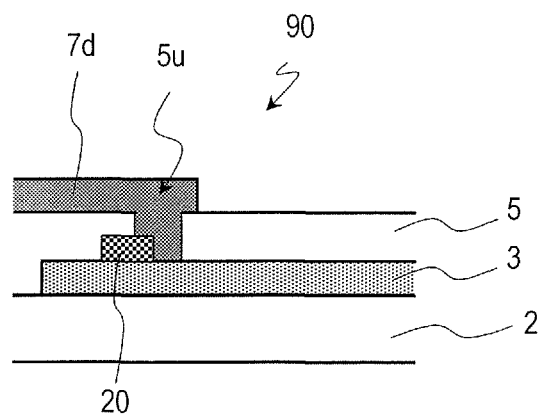
FIG. 22 A schematic cross-sectional view illustrating an exemplary contact portion 90 according to an embodiment of the present invention.
Figure 23:
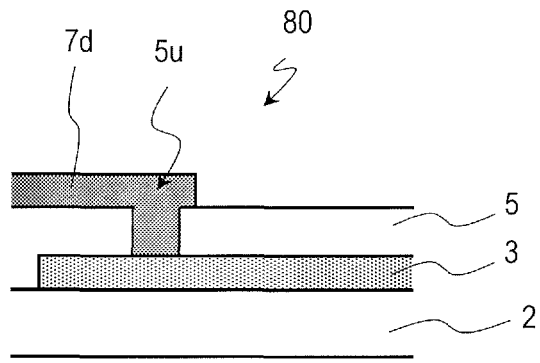
FIG. 23 A schematic cross-sectional view illustrating a contact portion 80 as a comparative example.

FIG. 22 is a cross-sectional view schematically illustrating a contact portion 90 in a semiconductor device according to this embodiment. For the purpose of comparison, the configuration of a contact portion 80 in which the transparent conductive layer 3 and metal layer 7d are directly in contact with each other is shown in FIG. 23.

As shown in FIG. 22, the semiconductor device of this embodiment includes a substrate 2, a transparent conductive layer 3 supported by the substrate 2, an insulating layer 5 which is formed to cover the transparent conductive layer 3, and a metal layer 7d. This semiconductor device includes a contact portion 90 to electrically connect the metal layer 7d and transparent conductive layer 3 together. In the contact portion 90, a hole (contact hole) 5u has been cut through the insulating layer 5 so as to be located over a portion of the upper surface of the transparent conductive layer 3. The hole 5u may be arranged to overlap with the transparent conductive layer 3 at least partially. The metal layer 7d has been formed on the insulating layer 5 and inside the hole 5u. In addition, in the contact portion 90, a refractory metal nitride layer 20 is further arranged between the transparent conductive layer 3 and a portion of the metal layer 7d which is located inside the hole 5u. The nitride layer 20 is provided so as to contact with the upper surface of the transparent conductive layer 3.

In the example illustrated in FIG. 22, the nitride layer 20 is in contact with a portion of the metal layer 7d which is located inside the hole 5u. Optionally, another conductive layer may be interposed between that portion of the metal layer 7d located inside the hole 5u and the nitride layer 20.

With the contact portion 90 shown in FIG. 22, the following effects can be achieved.

As described above, in the contact portion 80 of the comparative example, resistance increases between the transparent conductive layer 3 and the metal layer 7d, and the degree of contact between the upper surface of the transparent conductive layer 3 and the metal layer 7d decreases. These problems are remarkable particularly when an indium oxide based material is used for the transparent conductive layer. On the other hand, according to this embodiment, the nitride layer 20 is interposed between the transparent conductive layer 3 and the metal layer 7d, and therefore, the resistance in the contact portion can be reduced to a low level. In addition, by covering the upper surface of the transparent conductive layer 3 with the nitride layer 20, the decrease in the degree of close contact due to the property at the upper surface of the transparent conductive layer 3 can be checked, too.

As will be described later, if the nitride layer 20 is formed on the upper surface of the transparent conductive layer 3 that has just been formed, it is possible to check even more effectively the increase in the resistance of the contact portion 90 and the decrease in the degree of close contact due to alteration of the upper surface of the transparent conductive layer 3 during the manufacturing process.

In the example illustrated in FIG. 22, the nitride layer 20 is arranged in only a portion of the interface between the metal layer 7d and the transparent conductive layer 3, and the metal layer 7d is in contact with both of the nitride layer 20 and the transparent conductive layer 3 inside the hole 5u. Optionally, the nitride layer 20 may be arranged over the entire interface between the metal layer 7d and the transparent conductive layer 3. For example, the hole 5u may be arranged inside the nitride layer 20 when viewed along a normal to the substrate 2. In that case, the metal layer 7d is not directly in contact with the transparent conductive layer 3 inside the hole 5 but is connected to the transparent conductive layer 3 via the nitride layer 20.

This embodiment is applicable to a TFT substrate for use in a liquid crystal display device, for example. In that case, the transparent conductive layer 3 may be a pixel electrode and the metal layer 7d may be either the drain electrode 7d of a TFT or an electrode layer which is electrically connected to the drain electrode 7d. Also, the insulating layer 5 may include the TFT's gate insulating layer.

It should be noted that the semiconductor device of this embodiment just needs to include such a contact portion 90 that electrically connects the transparent conductive layer 3 and metal layer 7d together. And such a contact portion 90 does not have to be a contact portion to be provided between a TFT and a pixel electrode but may also be a terminal portion or a connecting portion to connect multiple lines together as well.

Next, a more specific configuration for a semiconductor device according to this embodiment will be described on the supposition that the device is implemented as a TFT substrate.

FIG. 1(a) is a schematic plan view of a TFT substrate 100A according to an embodiment of the present invention. FIGS. 1(b) and 1(c) are schematic cross-sectional views of the TFT substrate 100A as respectively viewed on the planes A-A' and B-B' shown in FIG. 1(a). And FIG. 1(d) is an enlarged plan view illustrating, on a larger scale, a region of the TFT substrate 100A including the contact portion.

As shown in FIGS. 1(a) to 1(d), this TFT substrate 100A includes a substrate 2, a gate electrode 4 and a pixel electrode (transparent conductive layer) 3 formed on the substrate 2, an insulating layer 5 which is formed over the gate electrode 4 and the pixel electrode 3, a semiconductor layer 6 which overlaps with the gate electrode 4 with the insulating layer 5 interposed between them, a source electrode 7s and a drain electrode (metal layer) 7d which are electrically connected to the semiconductor layer 6, and a contact portion 90 which electrically connects the drain electrode 7d and the pixel electrode 3 together.

In the contact portion 90, a refractory metal nitride layer 20 is arranged between a portion of the metal layer 7d which is located inside a hole 5u that has been cut through the insulating layer 5 and the upper surface of the transparent conductive layer 3. The contact portion 90 may have the same configuration as what has already been described with reference to FIG. 22. This TFT substrate 100A includes such a contact portion 90, and therefore, can reduce the resistance between the pixel electrode 3 and the drain electrode 7d to a low level and can increase the degree of close contact between them.

According to this embodiment, when viewed along a normal to the substrate 2, the nitride layer 20 has a different shape from the drain electrode (metal layer) 7d as can be seen from FIGS. 1(a) and 1(d). As can be seen, by forming the nitride layer 20 and drain electrode 7d by patterning separately from each other in this manner, the nitride layer 20 can be arranged in only a required area, and therefore, the manufacturing cost can be reduced to a low level.

It should be noted that the nitride layer 20 is suitably formed after the pixel electrode 3 has been formed and before the insulating layer 5 is formed. If the insulating layer 5 were formed before the nitride layer 20, the portion of the upper surface of the pixel electrode 3 which is exposed inside the hole 5u of the insulating layer 5 could get damaged by the process of patterning the insulating layer 5. However, if the nitride layer 20 is formed before the insulating layer 5, the upper surface of the pixel electrode 3 is protected with the nitride layer 20 when the insulating layer 5 is patterned, and therefore, the increase in the resistance of the contact portion 90 and the decrease in the degree of close contact can be checked effectively. Also, if the nitride layer 20 is formed before the insulating layer 5 and if the nitride layer 20 is larger than the hole 5u, then at least a portion of the upper surface of the nitride layer 20 contacts with the insulating layer 5.

Next, the planar shape of the contact portion 90 will be described in further detail with reference to FIG. 1(d). The nitride layer 20 just needs to be arranged so as to overlap at least partially with the hole 5u of the insulating layer 5 when viewed along a normal to the substrate 2. For example, a portion of the nitride layer 20 may overlap with the hole 5u and the rest of the nitride layer 20 may be located in the region surrounding the hole 5u as shown in FIG. 1(d). By adopting such a configuration in which the nitride layer 20 is arranged so as to overlap partially with the hole 5u, not only the pattern size of the nitride layer 20 but also the size of the hole 5u can be further reduced, compared to a configuration in which the nitride layer 20 is arranged to overlap with the entire hole 5u. Consequently, constraints on the design of the contact portion 90 can be relaxed.

This TFT substrate 100A may include a protective layer 8 which is formed over the source and drain electrodes 7s, 7d and a common electrode 9 which overlaps at least partially with the pixel electrode 3 with the protective layer 8 interposed between them. As a result, a storage capacitor which uses the protective layer 8 as a dielectric layer can be formed. Also, if the pixel electrode 3 and common electrode 9 are made of a transparent electrode material (such as ITO (indium tin oxide)), a decrease in the aperture ratio of each pixel can be minimized. In this description, such a storage capacitor made of a transparent material will be sometimes hereinafter referred to as a "transparent storage capacitor". The common electrode 9 does not have to be divided into multiple portions associated with pixels, but may be provided to cover the display area almost entirely. The hole 5u described above is located closer to the substrate 2 than to the common electrode 9.

In the example illustrated in FIG. 1(a), the TFT substrate 100A includes source lines 7(m) and 7(m+1) which are electrically connected to the source electrode 7s of their associated pixel and which are formed on the insulating layer 5. In addition, a gate line 14 has been formed between the pixel electrodes 3(m) and 3(m+1) of the adjacent pixels. These pixel electrodes 3(m) and 3(m+1) and the gate line 14 have all been formed between the substrate 2 and the insulating layer 5.

In this TFT substrate 100A, the pixel electrode 3 is arranged closer to the substrate 2 than the gate insulating layer (i.e., the insulating layer 5) is, and a contact hole (i.e., the hole 5u) has been cut through the insulating layer 5 to connect the drain electrode 7d to the pixel electrode 3. That is why the protective layer 8 formed over the TFT can have a substantially flat upper surface. Consequently, the shape of the contact hole does not affect easily the orientation of liquid crystal molecules in the liquid crystal layer to be arranged over the protective layer 8 and will not cause display defects easily. In contrast, in a configuration in which a pixel electrode is arranged over a TFT with a protective layer interposed between them, a contact hole to connect the pixel electrode to the drain electrode is cut through the protective layer. That is why the upper surface of the protective layer does not become flat around the contact hole, and the shape of the contact hole could affect the orientation of liquid crystal molecules in the liquid crystal layer to be arranged over the protective layer.

Furthermore, in this TFT substrate 100A, the drain electrode 7d arranged over the insulating layer 5 and the nitride layer 20 arranged under the insulating layer 5 are brought into contact with each other inside the hole 5u of the insulating layer 5. However, no insulating layer may be provided between the nitride layer 20 and the drain electrode 7d as will be described later. Nevertheless, if the insulating layer 5 is provided there and if the contact portion 90 is formed inside its hole 5u, the aperture ratio of each pixel can be further increased. The reason will be described later.

Next, respective components of the TFT substrate 100A will be described in detail one by one.

The substrate 2 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 2 may also be a silicon substrate.

The pixel electrode 3(m), 3(m+1) and common electrode 9 are each a transparent conductive layer of indium oxide or zinc oxide, which may be an ITO (indium tin oxide) layer or an IZO™ (indium zinc oxide) layer, for example. The pixel electrode 3(m), 3(m+1) and common electrode 9 may each have a thickness of 20 nm to 200 nm (e.g., 100 nm, for example).

The refractory metal nitride layer 20 may be a molybdenum nitride (MoN) layer, a titanium nitride (TiN) layer, or a tantalum nitride (TaN) layer, for example. The nitride layer 20 suitably has a thickness of 5 nm or more. In that case, an increase in the resistance of the contact portion 90 can be checked with more certainty. Also, the thickness of the nitride layer 20 is suitably equal to or smaller than that of the insulating layer 5 (e.g., 400 nm or less).

The gate electrode 4 and the gate line 14 may form integral parts of the same layer, and may be formed out of a metal film of an element selected from the group consisting of Mo (molybdenum), Al (aluminum), Ti (titanium), W (tungsten), Ta (tantalum), and Cu (copper) or an alloy or metal nitride which is comprised mostly of any of these elements or may even have a structure in which these metal films are stacked one upon the other. The gate electrode 4 and gate line 14 may have a thickness of about 50 nm to about 600 nm (e.g., 420 nm).

The insulating layer 5 may be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the insulating layer 5 may fall within the range of about 50 nm to about 600 nm, for example. To form a dense insulating layer 5 which causes little gate leakage current at low temperatures, the insulating layer 5 is suitably formed using a rare gas of Ar (argon), for example.

The semiconductor layer 6 may be a silicon based semiconductor layer such as an amorphous silicon (a-Si) layer, a polysilicon (p-Si) layer or a microcrystalline silicon (μ-Si) layer or may even be an oxide semiconductor layer. The semiconductor layer 6 may have a thickness of about 30 nm to about 100 nm (e.g., about 50 nm).

If an oxide semiconductor layer is used as the semiconductor layer 6, the size of a TFT can be reduced and the decrease in the aperture ratio of pixels can be checked, because a TFT with an oxide semiconductor layer has high mobility as described above. In addition, since an oxide semiconductor layer can be formed at a lower temperature than a silicon-based semiconductor layer, a substrate with low thermal resistance can be used. For example, by forming an oxide semiconductor layer on a plastic substrate or a film substrate, a semiconductor device applicable to a flexible display can be fabricated.

The oxide semiconductor layer may be formed out of an In—Ga—Zn—O based semiconductor film including In (indium), Ga (gallium) and Zn (zinc) at a ratio of 1:1:1, for example. The ratio of In, Ga and Zn may be selected appropriately.

If an amorphous In—Ga—Zn—O based semiconductor film is used as the In—Ga—Zn—O based semiconductor film, the In—Ga—Zn—O based semiconductor film can be formed at a low temperature and high mobility can be achieved. However, the amorphous In—Ga—Zn—O based semiconductor film may be replaced with an In—Ga—Zn—O based semiconductor film which exhibits crystallinity with respect to a predetermined crystal axis (C-axis).

The semiconductor layer 6 does not have to be formed out of an In—Ga—Zn—O based semiconductor film, but may also be formed out of any other suitable oxide semiconductor film such as a Zn—O based semiconductor (ZnO) film, an In—Zn—O based semiconductor (IZO) film, a Zn—Ti—O based semiconductor (ZTO) film, a Cd—Ge—O based semiconductor film, a Cd—Pb—O based semiconductor film, a CdO (cadmium oxide) film, or an Mg—Zn—O based semiconductor film. Furthermore, the oxide semiconductor layer may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all.

The source electrode 7s, drain electrode 7d and the source lines 7(m) and 7(m+1) may be formed out of a metal film of an element selected from the group consisting of Mo (molybdenum), Al (aluminum), Ti (titanium), W (tungsten), Ta (tantalum), and Cu (copper) or an alloy which is comprised mostly of any of these elements or may even have a structure in which these metal films are stacked one upon the other. The source electrode 7s, drain electrode 7d and the source lines 7(m) and 7(m+1) each suitably have a thickness of about 50 nm to about 600 nm, and may have a thickness of approximately 350 nm, for example.

The protective layer 8 has been formed over the source and drain electrodes 7s, 7d and source lines 7(m), 7(m+1). As the protective layer 8, an inorganic insulating film (passivation film) including an Si nitride or an Si oxide such as an $SiO_x$ (silicon oxide) film, an $SiN_x$ (silicon nitride) film, an $SiO_xN_y$ (silicon oxynitride, where x>y) film, or an $SiN_xO_y$ (silicon nitride oxide, where x>y) film may be used, or an $Al_2O_3$ (aluminum oxide) film or a $Ta_2O_5$ (tantalum oxide) film may also be used.

In the illustrated example, the protective layer 8 is arranged between the common electrode 9 and the pixel electrode 3. As a result, a transparent storage capacitor which uses the protective layer 8 as a dielectric layer and the transparent common electrode 9 and pixel electrode 3 as capacitor electrodes is formed. Thus, when this TFT substrate 100A is used in a display panel, a display panel with a high aperture ratio can be fabricated. The protective layer 8 suitably has a thickness of about 50 nm to about 300 nm (e.g., approximately 200 nm).

This TFT substrate 100A may be used in a fringe field switching (FFS) mode liquid crystal display device, for example. In that case, a display signal voltage is applied to the pixel electrode 3 and either a common voltage or a counter voltage is applied to the upper common electrode 9. At least one slit 19 is cut through the common electrode 9 (see FIGS. 1(a) and 1(d)).

Figure 2:
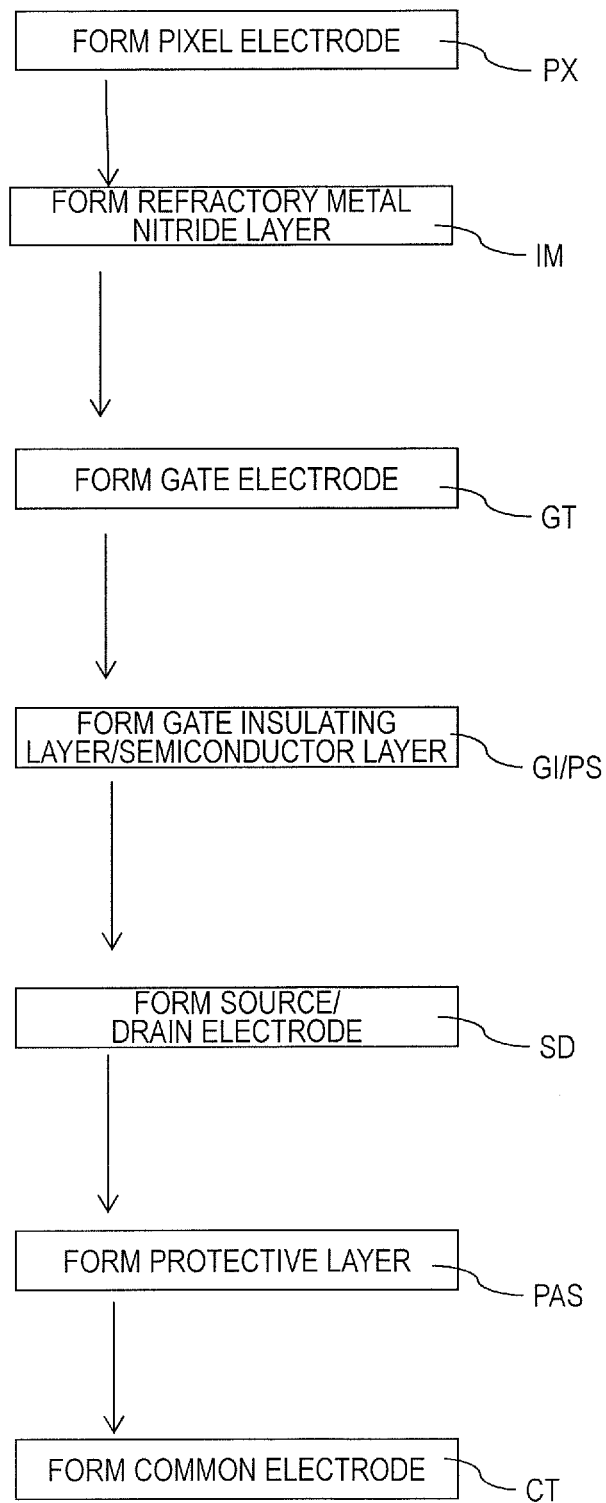
FIG. 2 A block diagram illustrating how the TFT substrate 100A may be fabricated.
Figure 3:
FIG. 3 (*a*) through (*g*) are schematic cross-sectional views illustrating how the TFT substrate 100A may be fabricated.
Figure 3:
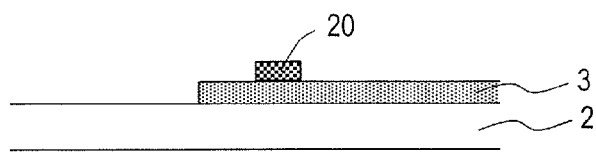
Figure 3:
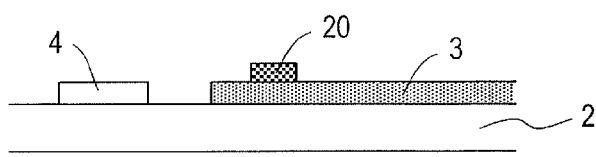
Figure 3:
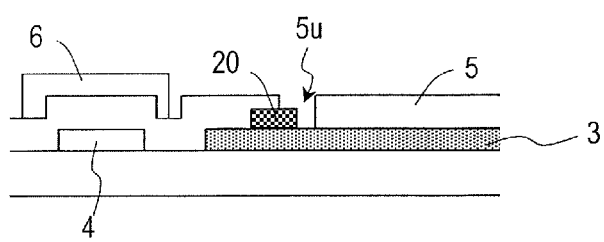
Figure 3:
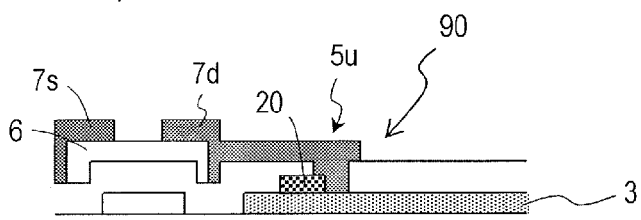
Figure 3:
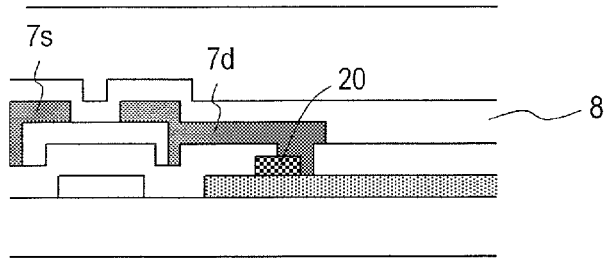
Figure 3:
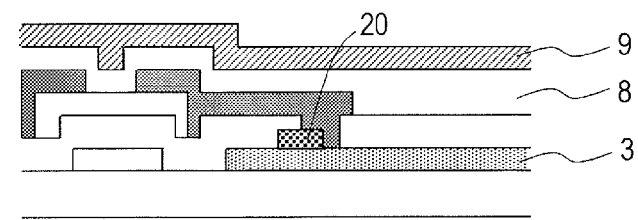

Next, an exemplary method for fabricating the TFT substrate 100A will be described with reference to FIGS. 2 and 3. FIG. 2 is a block diagram illustrating how to fabricate the TFT substrate 100A. FIGS. 3(a) through 3(g) are schematic cross-sectional views illustrating how to fabricate the TFT substrate 100A.

As shown in FIG. 2, the manufacturing process of the TFT substrate 100A includes a pixel electrode forming process step PX, a refractory metal nitride layer forming process step IM, a gate electrode forming process step GT, a gate insulating layer/semiconductor layer forming process step GI/PS, a source/drain electrode forming process step SD, a protective layer forming process step PAS and a common electrode forming process step CT. And the manufacturing process advances in this order.

Specific manufacturing process steps will now be described with reference to FIGS. 3(a) through 3(g), which are cross-sectional views corresponding to the one shown in FIG. 1(b).

As shown in FIG. 3(a), in the pixel electrode forming process step PX, a conductive film (not shown), which may be a transparent conductive film such as an ITO film, is formed on the substrate 2 by sputtering process, for example, and then patterned by photolithographic and wet etching processes, for example, thereby forming a pixel electrode 3. After the pixel electrode 3 has been obtained by patterning, the resist (not shown) that has been used in the patterning process is stripped.

Next, as shown in FIG. 3(b), in the refractory metal nitride layer forming process step IM, a refractory metal nitride film is deposited over the pixel electrode 3 by performing a sputtering process in a nitrogen ambient, for example. And the nitride film is patterned by photolithographic and wet etching processes, for example, thereby forming a nitride layer 20 on a portion of the pixel electrode 3. After that, the resist (not shown) is stripped.

Subsequently, as shown in FIG. 3(c), in the gate electrode forming process step GT, a conductive film is deposited over the substrate 2 by sputtering process, for example, and then patterned by photolithographic process and wet or dry etching process, for example, thereby forming a gate electrode 4. The gate electrode 4 is formed so as not to be electrically connected to the pixel electrode 3. Also, in forming the gate electrode 4 by patterning, the conductive film is selectively etched without removing the nitride layer 20 by taking advantage of the difference in etch rate between the conductive film to be the gate electrode 4 and the nitride layer 20. After the gate electrode 4 has been formed by patterning, the resist (not shown) that has been used for the patterning process is stripped.

Thereafter, as shown in FIG. 3(d), in the gate insulating layer/semiconductor layer forming process step GI/PS, an insulating film (not shown) is deposited over the gate electrode 4 and pixel electrode 3 by CVD (chemical vapor deposition) process, for example. Next, the insulating film is patterned by photolithographic and dry etching processes, for example, thereby forming an insulating layer 5 with a hole 5u, which is arranged so as to overlap at least partially with the region in which the pixel electrode 3 and the nitride layer 20 overlap with each other when viewed along a normal to the substrate 2. The hole 5u is suitably cut so as to be located entirely over the pixel electrode 3. Through this hole 5u, part (or all) of the upper surface of the nitride layer 20 is exposed. After that, the resist (not shown) that has been used for the patterning process is stripped.

Next, a semiconductor film (not shown), which may be an In—Ga—Zn—O based semiconductor film, for example, is formed over the insulating layer 5 by sputtering process, for example, and then patterned by photolithographic and dry etching processes, for example, thereby forming a semiconductor layer 6. The semiconductor layer 6 is formed so as to overlap with the gate electrode 4 with the insulating layer 5 interposed between them. After the semiconductor layer 6 has been formed by patterning, the resist (not shown) that has been used for the patterning process is stripped.

Then, as shown in FIG. 3(e), in the source/drain electrode forming process step SD, a metal film (not shown) is deposited over the semiconductor layer 6 and the insulating layer 5 and inside the hole 5u by sputtering process, for example. Thereafter, the metal film is patterned by photolithographic and wet etching processes, thereby forming source and drain electrodes 7s and 7d. After the source and drain electrodes 7s, 7d have been formed by patterning, the resist (not shown) that has been used for the patterning process is stripped.

The source and drain electrodes 7s, 7d are each electrically connected to the semiconductor layer 6. A portion of the semiconductor layer 6 which contacts with the source electrode 7s becomes a source contact region. A portion of the semiconductor layer 6 which contacts with the drain electrode 7d becomes a drain contact region. And a region of the semiconductor layer 6 interposed between the source and drain contact regions becomes a channel region. The drain electrode 7d also contacts with the nitride layer 20 inside the hole 5u. Optionally, the drain electrode 7d may contact with both the nitride layer 20 and the pixel electrode 3 inside the hole 5u. In this manner, a contact portion 90 which connects the drain electrode 7d and the pixel electrode 3 is obtained.

Next, as shown in FIG. 3(f), in the protective layer forming process step PAS, an insulating film (not shown) is deposited over the source and drain electrodes 7s, 7d by CVD process, for example, and then patterned by photolithographic and dry etching processes, for example, thereby forming a protective layer 8. After the protective layer 8 has been formed by patterning, the resist (not shown) that has been used for the patterning process is stripped.

Then, as shown in FIG. 3(g), in the common electrode forming process step CT, a conductive film (not shown), which may be a transparent conductive film, is deposited over the protective layer 8 by sputtering process, for example. Thereafter, the conductive film is patterned by photolithographic and wet etching processes, thereby forming a common electrode 9. After the common electrode 9 has been formed by patterning, the resist (not shown) that has been used for the patterning process is stripped.

In this example, the common electrode 9 is formed so as to overlap with a part of the pixel electrode 3 with the insulating layer 5 and protective layer 8 interposed between them. As a result, a transparent storage capacitor which uses the insulating layer 5 and protective layer 8 as a dielectric layer can be formed.

According to this method, the nitride layer 20 is formed after the pixel electrode 3 has been formed and before the insulating layer 5 is formed as described above. Thus, it is possible to prevent the upper surface of the pixel electrode 3 from getting damaged while the insulating layer 5 is being formed by patterning process.

Although the nitride layer 20 is supposed to be formed after the pixel electrode 3 has been formed and before the gate electrode 4 is formed according to the method described above, the nitride layer 20 may also be formed after the gate electrode 4 has been formed. Nevertheless, if the nitride layer 20 is formed before the gate electrode 4 is formed, it is possible to prevent the surface of the pixel electrode 3 from getting altered by going through the gate insulating layer forming process step GI and the process steps that follow it to deteriorate the characteristic of the contact portion 90. Particularly if the nitride layer 20 is formed right after the pixel electrode 3 has been formed so as to cover (or cap) a portion of the upper surface of the pixel electrode 3 (i.e., a portion to define a contact portion 90), the upper surface of the pixel electrode 3 can be prevented even more effectively from getting altered.

If an electrode layer is formed out of polycrystalline ITO as the pixel electrode 3, wet etching is suitably adopted to form the gate electrode 4 and nitride layer 20 by patterning after the pixel electrode 3 has been formed. In that case, it is possible to prevent the characteristic of the upper surface of the pixel electrode 3 from deteriorating due to dry etching to cause a decrease in the degree of close contact or an increase in contact resistance.

Embodiment 2

A second embodiment of a semiconductor device according to the present invention will now be described. The semiconductor device of this embodiment is a TFT substrate for use in a display device.

Figure 4:
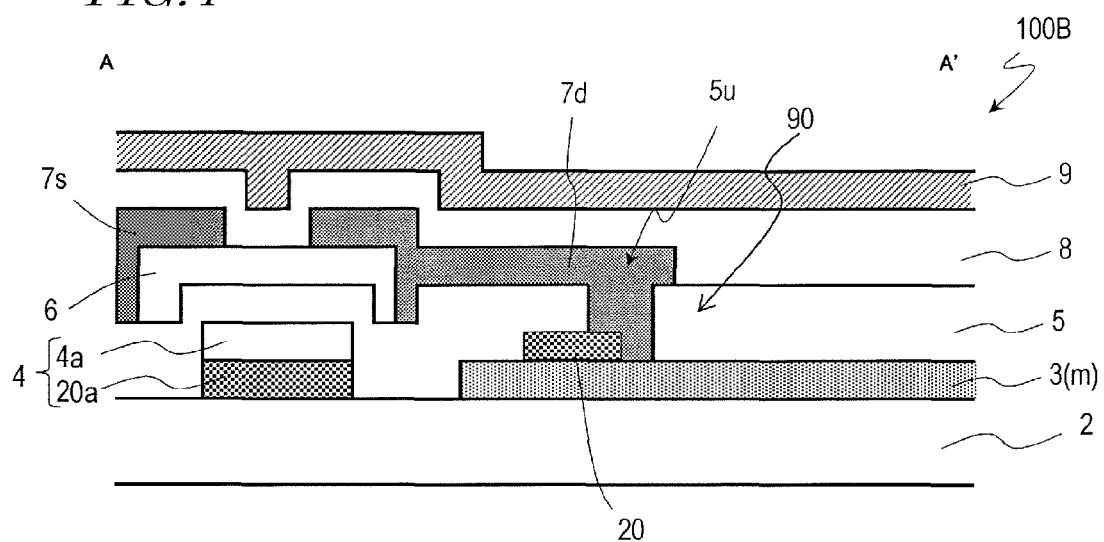
FIG. 4 A schematic cross-sectional view illustrating a TFT substrate 100B according to a second embodiment of the present invention.

FIG. 4 is a schematic cross-sectional view illustrating a TFT substrate 100B according to this embodiment. A plan view of the TFT substrate 100B and an enlarged plan view of the contact portion are just as shown in FIGS. 1(a) and 1(d). FIG. 4 illustrates a cross-sectional structure as viewed on the plane A-A' shown in FIG. 1(a). In FIG. 4, any component also included in the TFT substrate 100A shown in FIG. 1 and having substantially the same function as its counterpart is identified by the same reference numeral as its counterpart's and description thereof will be omitted herein to avoid redundancies.

As shown in FIG. 4, in this TFT substrate 100B, the gate electrode 4 (and the gate line 14) has a multilayer structure consisting of a first gate layer 20a which is formed out of the same metal nitride film as the nitride layer 20 and a second gate layer 4a which is formed on the first gate layer 20a. The second gate layer 4a is made of a different conductive material from the first gate layer 20a, and may be formed out of a metal film including an element selected from the group consisting of Mo (molybdenum), Al (aluminum), Ti (titanium), W (tungsten), Ta (tantalum), and Cu (copper). In the other respects, the configuration and the thicknesses and materials of the respective components are the same as in the TFT substrate 100A.

According to this embodiment, the nitride layer 20 is interposed between the drain electrode (metal layer) 7d and the pixel electrode (transparent conductive layer) 3 in the contact portion 90, and therefore, increase in contact resistance and decrease in the degree of close contact can be checked as much as in the first embodiment described above. In addition, since a first gate layer 20a of a refractory metal nitride is arranged under the second gate layer 4a, hillocks of the second gate layer 4a can be reduced. Furthermore, since the first gate layer 20a functions as a buffer, the degree of close contact between the gate electrode 4 and its underlying layer can be increased compared to a situation where the gate electrode consists of the second gate layer 4a alone.

Furthermore, as will be described in detail later, if a part of the metal nitride film is left as a layer under the gate electrode 4, then the gate electrode 4 and the nitride layer 20 can be formed using a single photomask. As a result, the number of photomasks to use, and eventually, the overall manufacturing cost, can be cut down.

Figure 5:
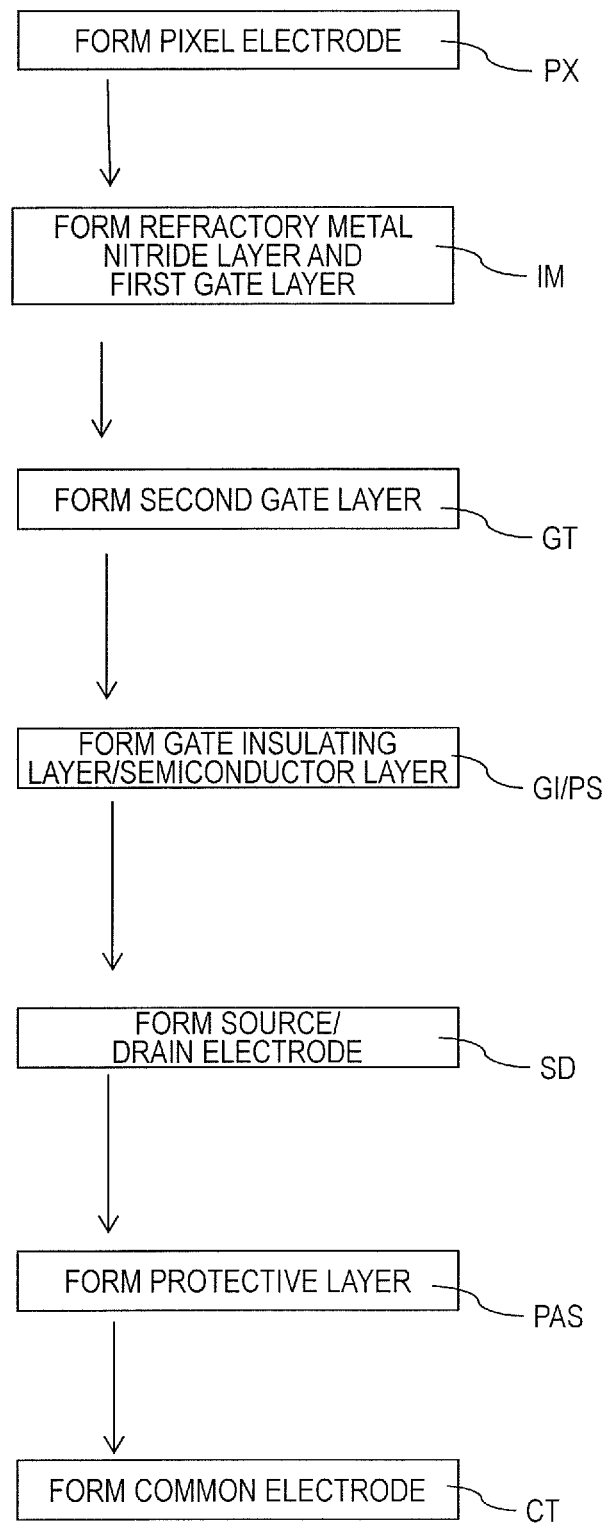
FIG. 5 A block diagram illustrating how the TFT substrate 100B may be fabricated.
Figure 6:
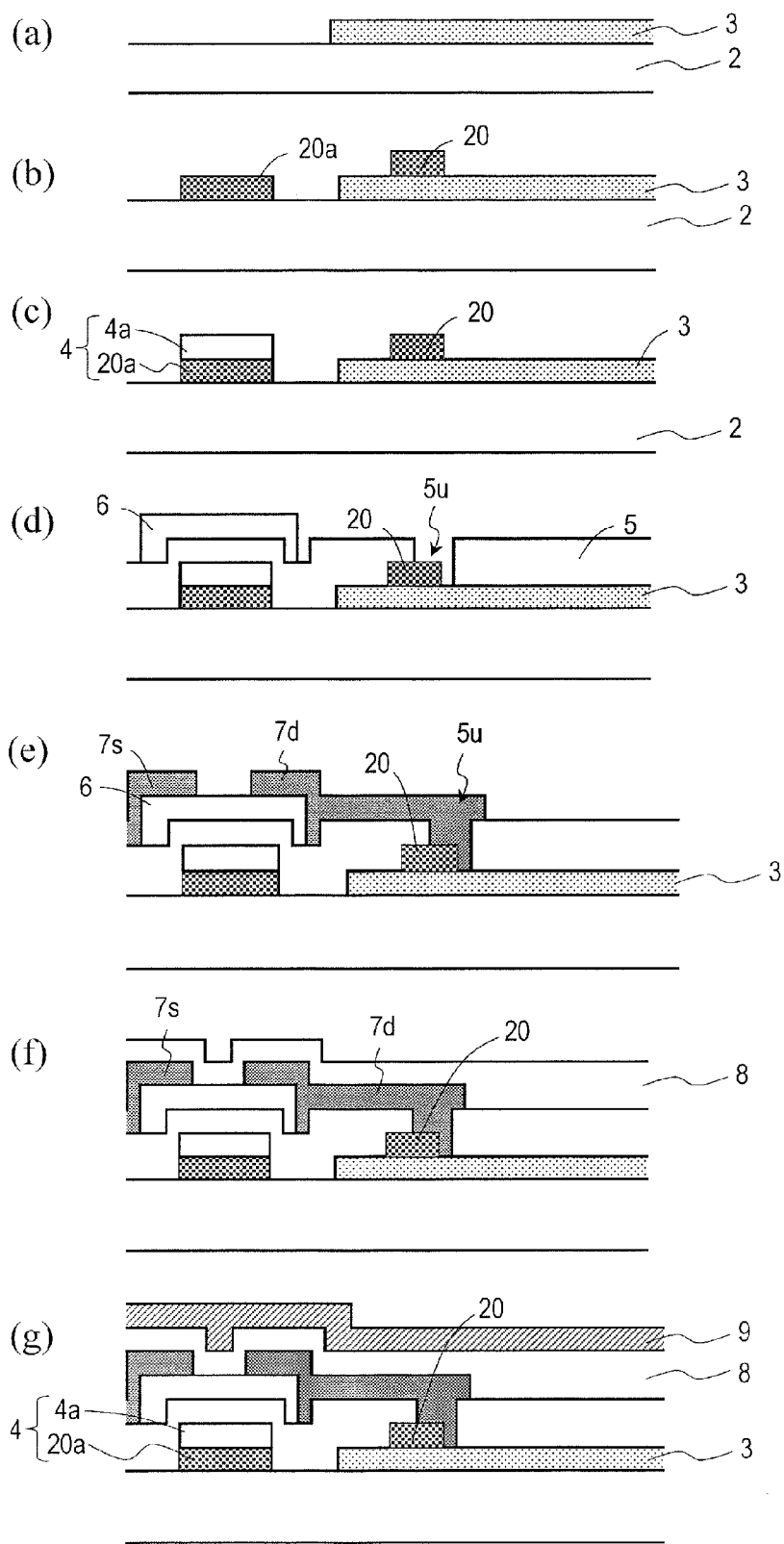
FIG. 6 (*a*) through (*g*) are schematic cross-sectional views illustrating how the TFT substrate 100B may be fabricated.

Next, an exemplary method for fabricating the TFT substrate 100B will be described in detail with reference to FIGS. 5 and 6. FIG. 5 is a block diagram illustrating how the TFT substrate 100B may be fabricated. FIGS. 6(a) through 6(g) are schematic cross-sectional views illustrating how the TFT substrate 100B may be fabricated and corresponding to FIG. 4.

As shown in FIG. 5, the manufacturing process of the TFT substrate 100B includes a pixel electrode forming process step PX, a refractory metal nitride layer and first gate layer forming process step IM, a second gate layer forming process step GT, a gate insulating layer/semiconductor layer forming process step GI/PS, a source/drain electrode forming process step SD, a protective layer forming process step PAS and a common electrode forming process step CT. And the manufacturing process advances in this order.

First of all, as shown in FIG. 6(a), a pixel electrode 3 is formed on the substrate 2. The pixel electrode 3 may be formed just as already described with reference to FIG. 3(a).

Next, as shown in FIG. 6(b), a refractory metal nitride film (not shown) is formed over the substrate 2 and patterned, thereby forming a nitride layer 20 which is located on a portion of the pixel electrode 3 and also forming a first gate layer 20a which is located on a region where no pixel electrode 3 has been formed. The first gate layer 20a is formed in a region where a gate electrode and a gate line will be formed. The nitride film may be formed just as already described with reference to FIG. 3(b).

Subsequently, as shown in FIG. 6(c), a second gate layer 4a is formed on the first gate layer 20a, thereby obtaining a gate electrode 4. The second gate layer 4a may be formed in the same way as in the process step of forming the gate electrode 4 that has already described with reference to FIG. 3(a). In the example illustrated in FIG. 6(c), the respective patterns of the first and second gate layers 20a and 4a are supposed to be aligned with each other. However, the second gate layer 4a just needs to overlap with the first gate layer 20a at least partially.

In this embodiment, the entire gate electrode 4 and gate line may have such a multilayer structure including the first and second gate layers 20a and 4a. Alternatively, only a part of the gate electrode and gate line may have such a multilayer structure and the rest of the gate electrode and gate line may be made of only one of the first and second gate layers 20a and 4a.

Thereafter, as shown in FIGS. 6(d) through 6(g), an insulating layer 5, a semiconductor layer 6, source and drain electrodes 7s, 7d, a protective layer 8 and a common electrode 9 are formed. These members may be formed just as already described with reference to FIGS. 3(d) to 3(g). In this manner, a TFT substrate 100B is completed.

According to the method described above, after the pixel electrode 3 has been formed and before the second gate layer 4a is formed, the nitride layer 20 is formed to cover the upper surface of the pixel electrode 3 partially. Thus, it is possible to prevent the upper surface of the pixel electrode 3 from being altered to deteriorate the characteristic of the contact portion 90 during the manufacturing process.

The TFT substrate 100B does not have to be fabricated by the method described above. Alternatively, the refractory metal nitride layer and first gate layer forming process step IM and second gate layer forming process step GT shown in FIG. 5 may be performed by half-tone exposure process using a single photomask as shown in FIGS. 7(a) through 7(e).

Figure 7:
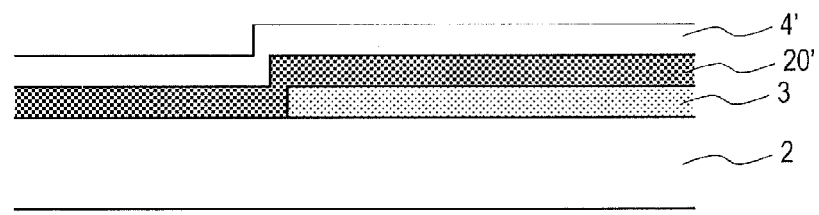
FIG. 7 (a) through (e) are schematic cross-sectional views illustrating how the TFT substrate 100B may be fabricated.
Figure 7:
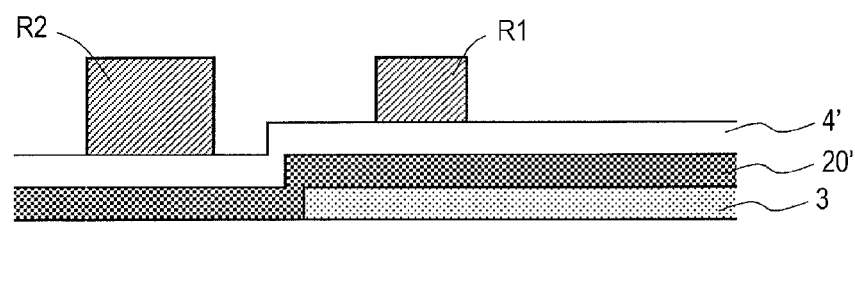
Figure 7:
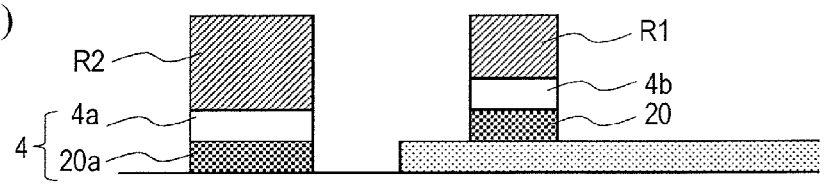
Figure 7:
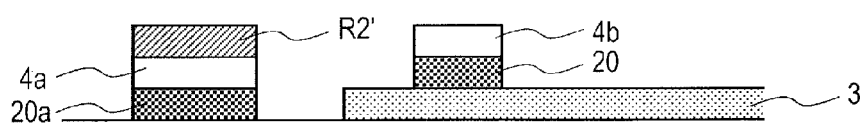
Figure 7:
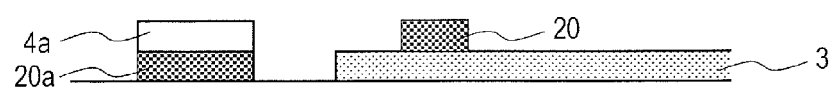

First of all, as shown in FIG. 7(a), a refractory metal nitride film (metal nitride film) 20' is formed over a substrate 2 on which a pixel electrode 3 has been formed, and then a conductive film 4' to be a second gate layer is stacked on the metal nitride film 20.

Next, as shown in FIG. 7(b), two resist films R1 and R2 with mutually different thicknesses are formed to have an intended pattern shape on the conductive film 4' by half-tone exposure process using a single photomask (which is also called a "half-tone mask"). Specifically, a resist film R1 is formed on a region of the pixel electrode 3 where a contact portion is going to be formed, and a resist film R3 which is thicker than the resist film R1 is formed on a region where a gate electrode and a gate line are going to be formed.

Subsequently, as shown in FIG. 7(c), portions of the metal nitride film 20' and conductive film 4' which are not covered with the resist films R1 and R2 are patterned by wet etching process. As a result of this patterning process, in the region defined by the resist film R1, a nitride layer 20 is formed out of the metal nitride film 20' and a conductive layer (that is a layer to be etched) 4b is formed out of the conductive film 4'. Meanwhile, in the region defined by the resist film R2, a first gate layer 20a is formed out of the metal nitride film 20' and a second gate layer 4a is formed out of the conductive film 4'. The first and second gate layers 20a and 4a form a gate electrode 4.

Next, as shown in FIG. 7(d), the resist film R1 is removed by dry etching process. As a result of this dry etching process, the resist film R2 is partially removed to turn into a resist film R2' which is thinner than the resist film R2.

Subsequently, the resist film R2' and the conductive layer 4b are further removed by dry etching process again. However, the second gate layer 4a that has been located under the resist film R2' is not removed but left.

Thereafter, although not shown, the gate insulating layer/semiconductor layer forming process step GI/PS, the source/drain electrode forming process step SD, the protective layer forming process step PAS and common electrode forming process step CT are performed as already described with reference to FIGS. 6(d) through 6(g), thereby completing the TFT substrate 100B.

According to this method, the nitride layer 20 and gate electrode 4 can be formed with a single photomask, and therefore, the number of photomasks to use, and eventually the overall manufacturing cost, can be cut down.

Optionally, the conductive layer 4b may be left instead of being removed, and the nitride layer 20 and the drain electrode 7d may be connected together via the conductive layer 4b as will be described later. However, if an Al layer or Cu layer is used as the second gate layer 4a, an oxide film will be formed on the surface to possibly make connection with the drain electrode 7d to be the upper layer non-stabilized and make the effective connection area smaller. In that case, the nitride layer 20 and the drain electrode 7d are suitably brought into contact with each other directly by removing the conductive layer 4b as is done in this embodiment.

Embodiment 3

A third embodiment of a semiconductor device according to the present invention will now be described. The semiconductor device of this embodiment is a TFT substrate for use in a display device.

Figure 8:
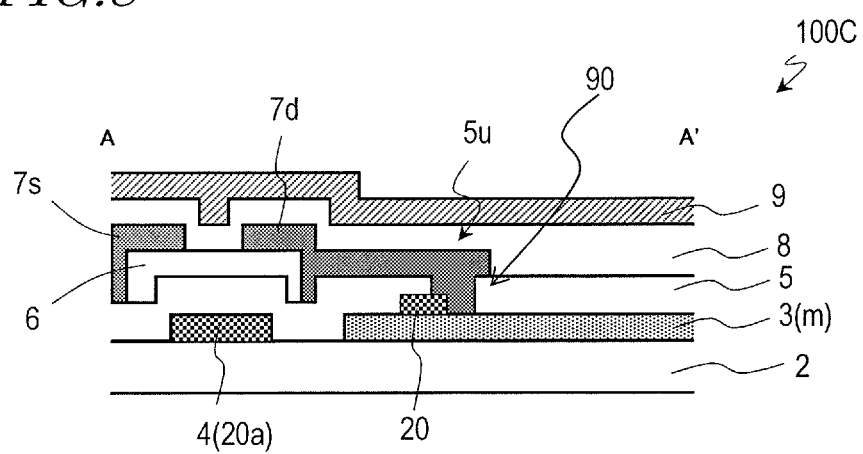
FIG. 8 A schematic cross-sectional view illustrating a TFT substrate 100C according to a third embodiment of the present invention.

FIG. 8 is a schematic cross-sectional view illustrating a TFT substrate 100C according to this embodiment. A plan view of the TFT substrate 100C and an enlarged plan view of the contact portion are just as shown in FIGS. 1(a) and 1(d). FIG. 8 illustrates a cross-sectional structure as viewed on the plane A-A' shown in FIG. 1(a). In FIG. 8, any component also included in the TFT substrate 100A shown in FIG. 1 and having substantially the same function as its counterpart is identified by the same reference numeral as its counterpart's and description thereof will be omitted herein to avoid redundancies.

In this TFT substrate 100C, the gate electrode 4 (20a) and gate line 14 are formed out of the same metal nitride film as the nitride layer 20, which is a major difference from the TFT substrate 100A (see FIG. 1) described above. In the other respects, however, the configuration and the thicknesses and materials of respective components of this TFT substrate 100C are the same as in the TFT substrate 100A described above.

According to this embodiment, the gate electrode 4 (20a) and gate line and the nitride layer 20 can be formed out of the same single metal nitride film, and therefore, increase in the resistance of the contact portion 90 and decrease in the degree of close contact can be checked without increasing the number of manufacturing process steps. Also, if the nitride layer 20 and gate electrode 4 were formed out of two different layers, the nitride layer 20 could be etched while the gate electrode 4 is being etched, thus making it difficult to get the process step of forming the nitride layer 20 done with good stability. However, according to this embodiment, such instability can be eliminated and the stability of the process can be increased significantly.

Figure 9:
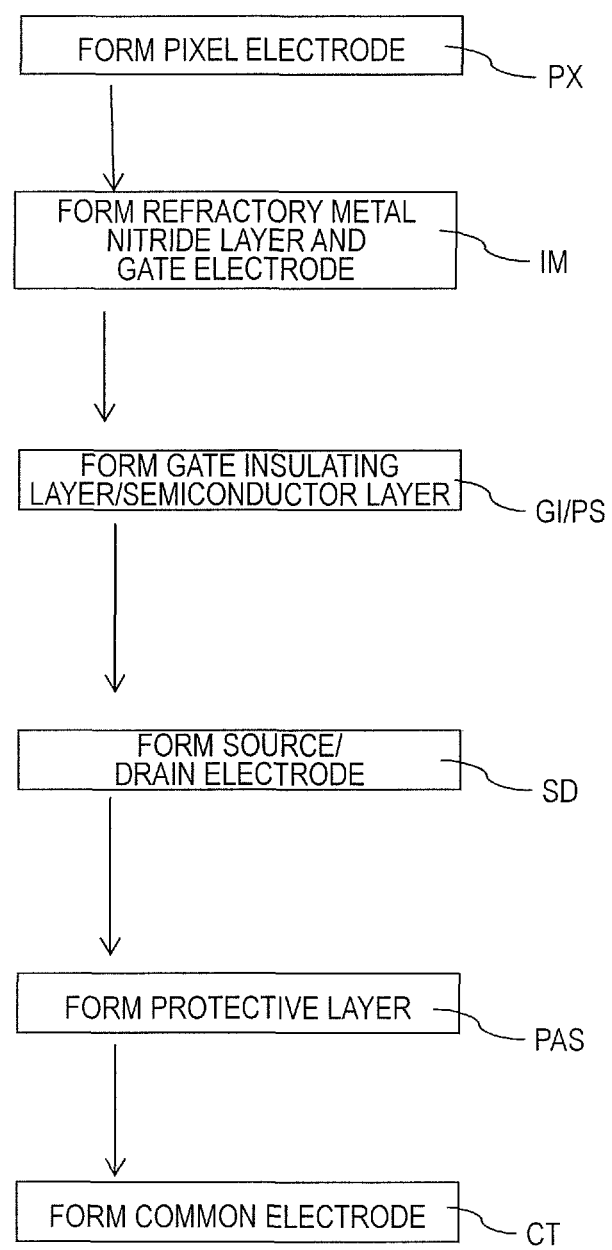
FIG. 9 A block diagram illustrating how the TFT substrate 100C may be fabricated.
Figure 10:
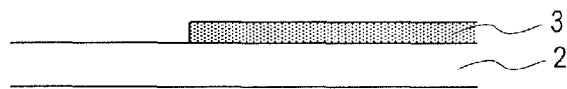
FIG. 10 (a) through (f) are schematic cross-sectional views illustrating how the TFT substrate 100C may be fabricated.
Figure 10:
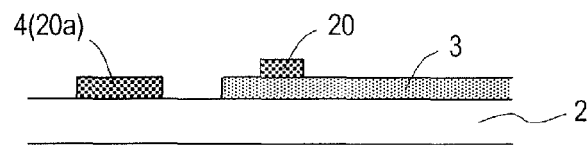
Figure 10:
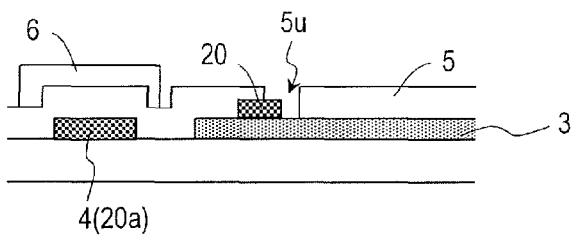
Figure 10:
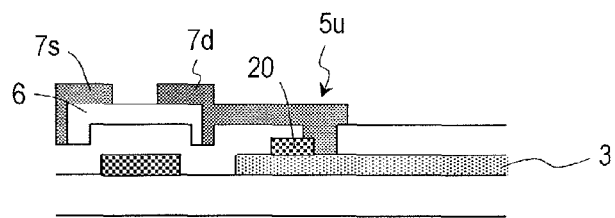
Figure 10:
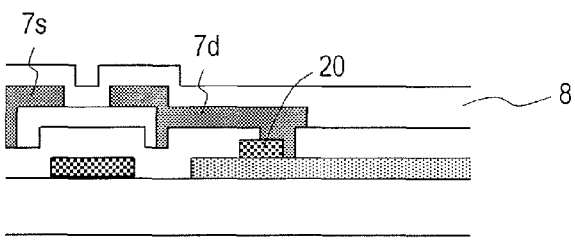
Figure 10:
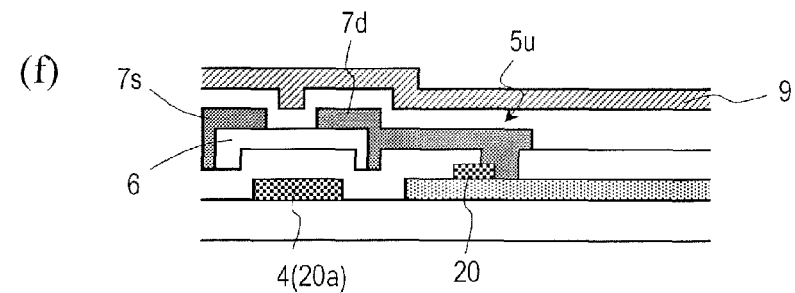

Next, an exemplary method for fabricating the TFT substrate 100C will be described in detail with reference to FIGS. 9 and 10. FIG. 9 is a block diagram illustrating how the TFT substrate 100C may be fabricated. FIGS. 10(a) through 10(f) are schematic cross-sectional views illustrating how the TFT substrate 100C may be fabricated and corresponding to FIG. 8.

As shown in FIG. 9, the manufacturing process of the TFT substrate 100C includes a pixel electrode forming process step PX, a refractory metal nitride layer and gate electrode forming process step IM, a gate insulating layer/semiconductor layer forming process step GI/PS, a source/drain electrode forming process step SD, a protective layer forming process step PAS and a common electrode forming process step CT. And the manufacturing process advances in this order.

First of all, as shown in FIG. 10(a), a pixel electrode 3 is formed on the substrate 2. The pixel electrode 3 may be formed just as already described with reference to FIG. 3(a).

Next, as shown in FIG. 10(b), a refractory metal nitride film (not shown) is formed over the substrate 2 and patterned, thereby forming a nitride layer 20 which is located on a portion of the pixel electrode 3 and also forming a gate electrode 4 (20a) which is located on a region where no pixel electrode 3 has been formed. The metal nitride film may be formed and patterned just as already described with reference to FIG. 3(b).

Subsequently, as shown in FIGS. 10(c) through 10(f), an insulating layer 5, a semiconductor layer 6, source and drain electrodes 7s, 7d, a protective layer 8 and a common electrode 9 are formed, thereby completing the TFT substrate 100C. These members may be formed just as already described with reference to FIGS. 3(d) through 3(g).

According to this method, the gate electrode forming process step GT can be cut compared to the manufacturing process of the TFT substrate 100A that has already been described with reference to FIGS. 2 and 3, and therefore, the number of photomasks to use can be reduced. In addition, the nitride layer 20 is formed on the pixel electrode 3 after the pixel electrode 3 has been formed and before the insulating layer 5 is formed. Thus, it is possible to prevent the upper surface of the pixel electrode 3 in the contact portion 90 from being altered during the process step of forming the insulating layer 5 or any other process step to be performed after that.

Embodiment 4

Figure 11:
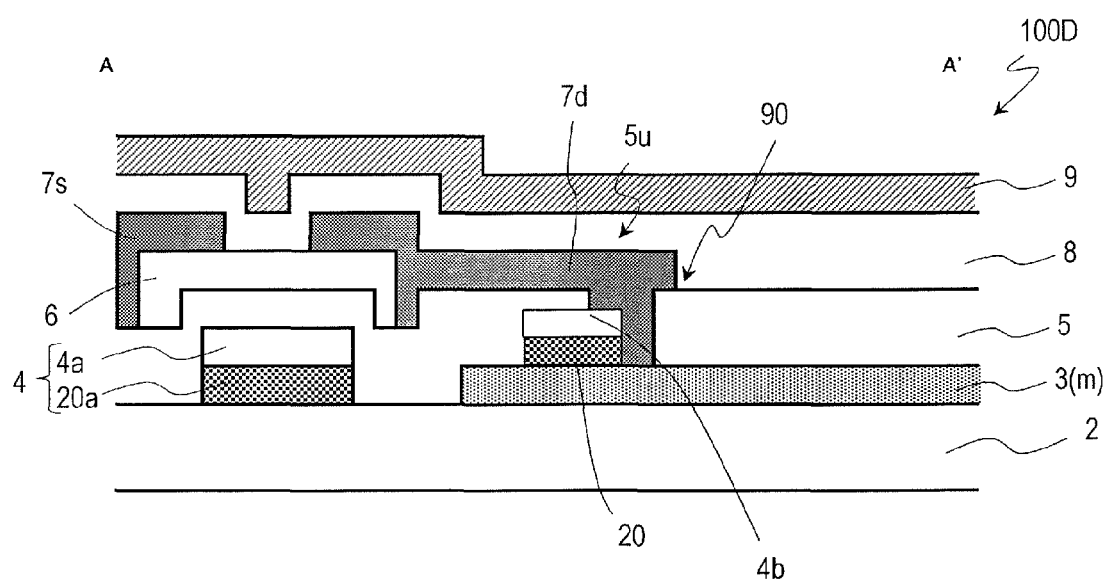
FIG. 11 A schematic cross-sectional view illustrating a TFT substrate 100D according to a fourth embodiment of the present invention.

FIG. 11 is a schematic cross-sectional view illustrating a TFT substrate 100D according to this embodiment. A plan view of the TFT substrate 100D and an enlarged plan view of the contact portion are just as shown in FIGS. 1(a) and 1(d). FIG. 11 illustrates a cross-sectional structure as viewed on the plane A-A' shown in FIG. 1(a). In FIG. 11, any component also included in the TFT substrate 100A shown in FIG. 1 and having substantially the same function as its counterpart is identified by the same reference numeral as its counterpart's and description thereof will be omitted herein to avoid redundancies.

In this TFT substrate 100D, the gate electrode 4 (and gate line 14) has a multilayer structure including a first gate layer 20a which is formed out of the same metal nitride film as the nitride layer 20 and a second gate layer 4a which is formed on the first gate layer 20a just like the TFT substrate 100B (see FIG. 4). The second gate layer 4a is made of a different conductive material from the first gate layer 20a. In addition, this TFT substrate 100D further includes a conductive layer 4b which is formed out of the same conductive film as the second gate layer 4a between the nitride layer 20 and the drain electrode 7d. The conductive layer 4b is in contact with not only the nitride layer 20 but also a portion of the drain electrode 7d located inside the hole 5u as well. In the other respects, the configuration and the thicknesses and materials of the respective components are the same as in the TFT substrate 100A.

According to this embodiment, the gate electrode 4 and gate line and the conductive layer to be formed between the nitride layer 20 and the drain electrode 7d in the contact portion 90 can be formed at the same time by patterning the same two films (i.e., a metal nitride film and a conductive film), and therefore, increase in the resistance of the contact portion 90 and decrease in the degree of close contact can be checked without increasing the number of manufacturing process steps. Also, if the nitride layer 20 and gate electrode 4 were formed out of two different layers, the nitride layer 20 could be etched while the gate electrode 4 is being etched, thus making it difficult to get the process step of forming the nitride layer 20 done with good stability. However, according to this embodiment, such instability can be eliminated, and the stability of the process can be increased significantly.

Figure 12:
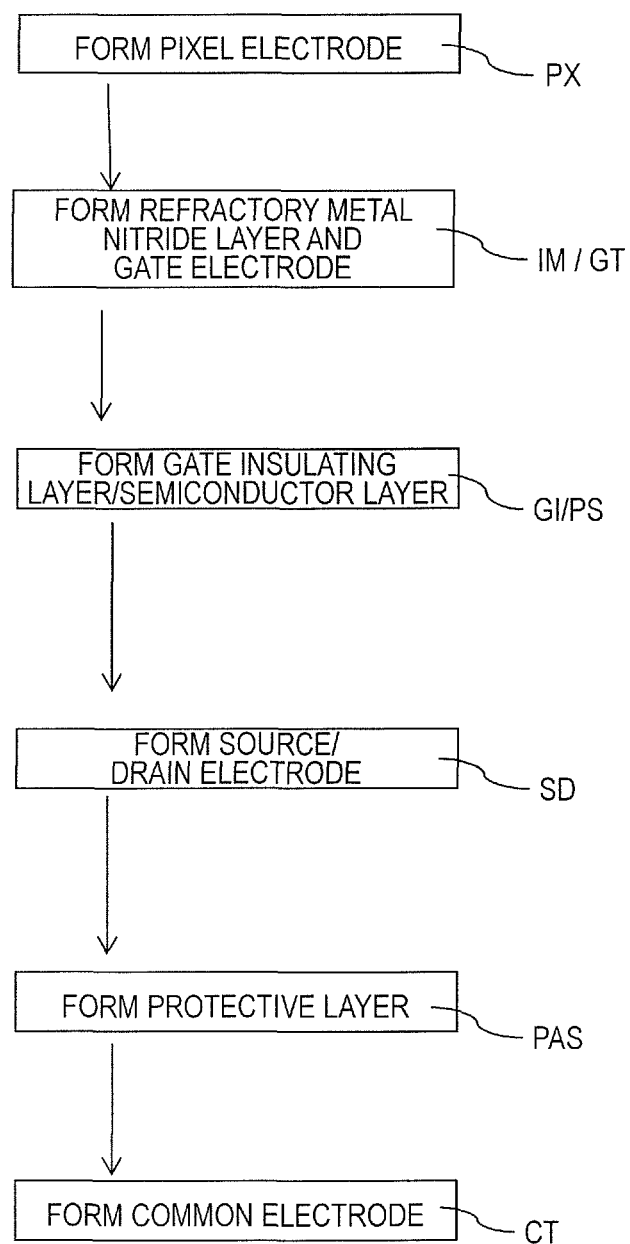
FIG. 12 A block diagram illustrating how the TFT substrate 100D may be fabricated.
Figure 13:
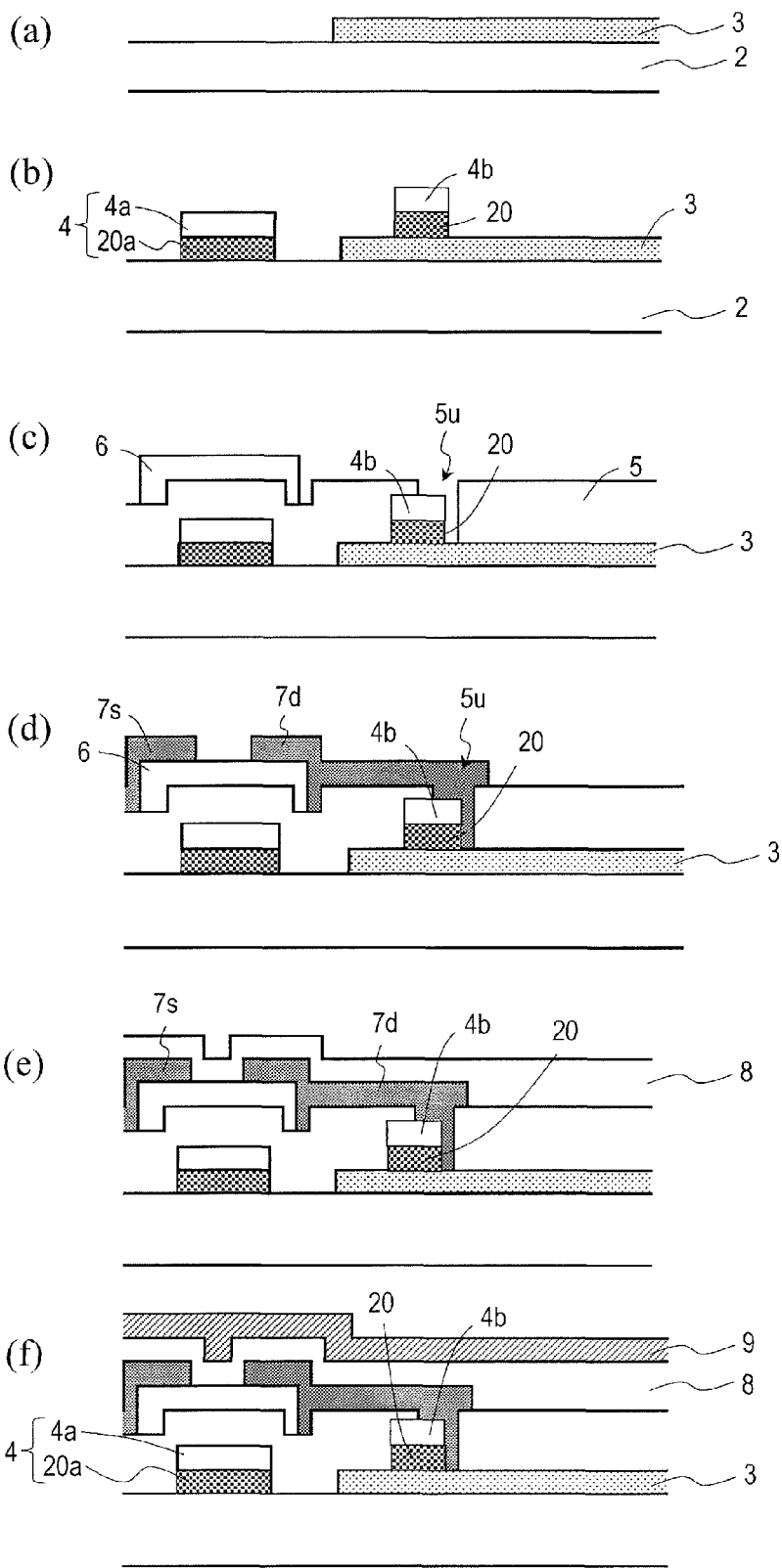
FIG. 13 (a) through (f) are schematic cross-sectional views illustrating how the TFT substrate 100D may be fabricated.

Next, an exemplary method for fabricating the TFT substrate 100D will be described in detail with reference to FIGS. 12 and 13. FIG. 12 is a block diagram illustrating how the TFT substrate 100D may be fabricated. FIGS. 13(a) through 13(f) are schematic cross-sectional views illustrating how the TFT substrate 100D may be fabricated and corresponding to FIG. 11.

As shown in FIG. 12, the manufacturing process of the TFT substrate 100D includes a pixel electrode forming process step PX, a refractory metal nitride layer and gate electrode forming process step IM/GT, a gate insulating layer/semiconductor layer forming process step GI/PS, a source/drain electrode forming process step SD, a protective layer forming process step PAS and a common electrode forming process step CT. And the manufacturing process advances in this order.

First of all, as shown in FIG. 13(a), a pixel electrode 3 is formed on the substrate 2. The pixel electrode 3 may be formed just as already described with reference to FIG. 3(a).

Next, as shown in FIG. 13(b), a refractory metal nitride film (not shown) and a conductive film (not shown, either) are formed in this order over the substrate 2 and patterned simultaneously, thereby forming a nitride layer 20 out of the nitride film and a conductive layer 4b out of the conductive film on a portion of the pixel electrode 3 and also forming a first gate layer 20a out of the nitride film and a second gate layer 4a out of the conductive film on a region where no pixel electrode 3 has been formed.

Subsequently, as shown in FIGS. 13(c) through 13(f), an insulating layer 5, a semiconductor layer 6, source and drain electrodes 7s, 7d, a protective layer 8 and a common electrode 9 are formed, thereby completing the TFT substrate 100D. These members may be formed just as already described with reference to FIGS. 3(d) through 3(g). In this embodiment, the drain electrode 7d is formed to contact with the conductive layer 4b inside the hole 5u.

According to this method, the gate electrode 4 and the nitride layer 20 can be formed with a single photomask, and therefore, the number of manufacturing process steps (i.e., the number of photomasks to use) can be reduced compared to the manufacturing process of the TFT substrate 100A. In addition, the nitride layer 20 is formed on the upper surface of the pixel electrode 3 after the pixel electrode 3 has been formed and before the insulating layer 5 is formed. Thus, it is possible to prevent the upper surface of the pixel electrode 3 in the contact portion 90 from being altered during the process step of forming the insulating layer 5 or any other process step to be performed after that.

Embodiment 5

A fifth embodiment of a semiconductor device according to the present invention will now be described. The semiconductor device of this embodiment is a TFT substrate for use in a display device.

FIGS. 14(a) and 14(b) are schematic cross-sectional views illustrating a TFT substrate 100E according to this embodiment. A plan view of the TFT substrate 100E and an enlarged plan view of the contact portion are just as shown in FIGS. 1(a) and 1(d). FIGS. 14(a) and 14(b) illustrate cross-sectional structures as respectively viewed on the planes A-A' and B-B' shown in FIG. 1(a). In FIGS. 14(a) and 14(b), any component also included in the TFT substrate 100A shown in FIG. 1 and having substantially the same function as its counterpart is identified by the same reference numeral as its counterpart's and description thereof will be omitted herein to avoid redundancies.

In this TFT substrate 100E, another insulating layer 5a is formed between the gate electrode 4, the insulating layer 5 and the pixel electrode 3, which is a major difference from the TFT substrate 100A.

In this TFT substrate 100E, the gate insulating layer has a double-layer structure consisting of insulating layers 5 and 5a, between which the pixel electrode 3 is arranged. In this embodiment, the insulating layer 5a will be hereinafter referred to as a "first gate insulating layer" and the insulating layer 5 through which a hole 5u is cut will be hereinafter referred to as a "second gate insulating layer".

The first and second gate insulating layers 5a and 5 may be made of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$).

Also, to prevent dopants from diffusing from the substrate 2 and to shorten the manufacturing process time, the lower, first gate insulating layer 5a may be made of $SiN_x$ or $SiN_xO_y$ (silicon nitride oxide, where x>y). An insulating layer made of silicon nitride has so high an etch rate that the process time can be shortened. The first gate insulating layer 5a may be provided to cover almost the entire surface of the display area (see FIG. 14(b)).

A silicon nitride layer, a silicon nitride oxide layer or any other suitable layer may be formed as the lower, first gate insulating layer 5a to prevent dopants from diffusing from the substrate 2. And a silicon dioxide layer, a silicon oxynitride layer or any other suitable layer may be formed on that layer to ensure an insulation property.

Figure 14:
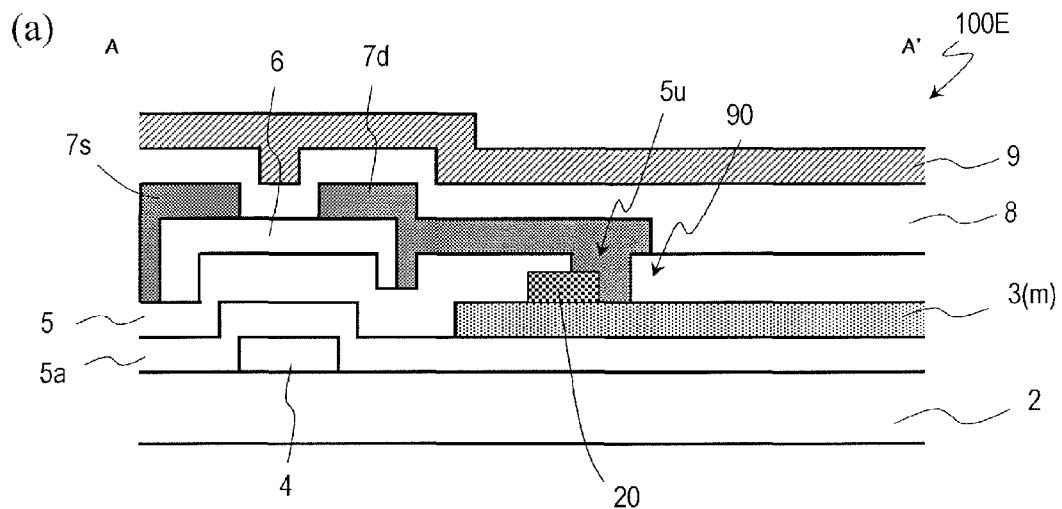
FIGS. 14 (a) and (b) are schematic cross-sectional views of a TFT substrate 100E according to a fifth embodiment of the present invention, wherein (a) and (b) illustrate cross sections as respectively viewed on the planes A-A' and B-B' shown in FIG. 1(a).
Figure 14:
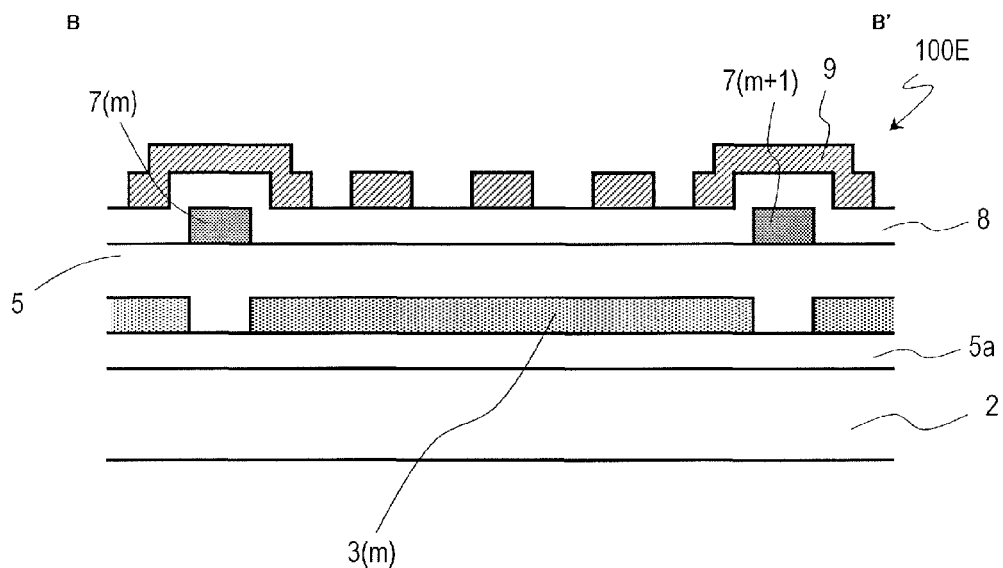

It should be noted that the gate electrode 4 and contact portion 90 do not have to have the configuration shown in FIG. 14. Although the first gate insulating layer 5a is provided for the TFT substrate 100A (see FIG. 1) in the example illustrated in FIG. 14, the first gate insulating layer 5a may also be provided for any of the other TFT substrates 100B to 100D as well.

According to this embodiment, by interposing the nitride layer 20 between the drain electrode 7d and the pixel electrode 3 in the contact portion 90, increase in the resistance of the contact portion 90 and decrease in the degree of close contact can be checked. In addition, since the gate electrode 4, the pixel electrode 3 and the nitride layer 20 are formed out of different layers with the insulating layer 5a interposed between them, it is possible to prevent the gate electrode 4 from being affected by the process being performed on the pixel electrode 3 and nitride layer 20 and to prevent the nitride layer 20 from being affected by the process being performed on the gate electrode 4. Consequently, the stability of the process can be increased significantly.

This embodiment is applicable effectively to a situation where an oxide semiconductor layer is used as the semiconductor layer 6. In an oxide semiconductor TFT, to maintain the property of the oxide semiconductor layer (i.e., to check a decrease in resistance), a layer including oxygen (e.g., an oxide insulating film such as $SiO_2$ or $SiO_xN_y$ (where x>y)) is suitably used as the second gate insulating layer 5 to be a gate insulating layer to contact with the oxide semiconductor layer. In that case, even if there are oxygen deficiencies in the oxide semiconductor layer, the oxygen deficiencies can be covered by oxygen included in the oxide layer. As a result, such oxygen deficiencies of the oxide semiconductor layer can be reduced and the oxide semiconductor layer can be prevented from having decreased resistance. Meanwhile, to form such an oxide insulating film, the etch rate should be so low that it will take a lot of process tact, which is a problem. To overcome such a problem, if the first gate insulating layer 5a of the gate insulating layer which is located closer to the gate electrode is formed out of an insulating film other than an oxide insulating film (e.g., a nitride film such as SiNx), then the ratio of the thickness of the oxide insulating film to the overall thickness of the gate insulating layer (which will be hereinafter referred to as "film thickness ratio") can be reduced. As a result, the process tact can be reduced with the decrease in the resistance of the oxide semiconductor layer checked. If this embodiment is applied to a semiconductor device including an oxide semiconductor TFT having a gate insulating layer with such a double-layer structure, the effect described above (i.e., increase in process stability) can be achieved by using the double layer structure of the gate insulating layer with high TFT performance maintained.

Next, an exemplary method for fabricating the TFT substrate 100E according to an embodiment of the present invention will be described with reference to FIGS. 15 and 16.

Figure 15:
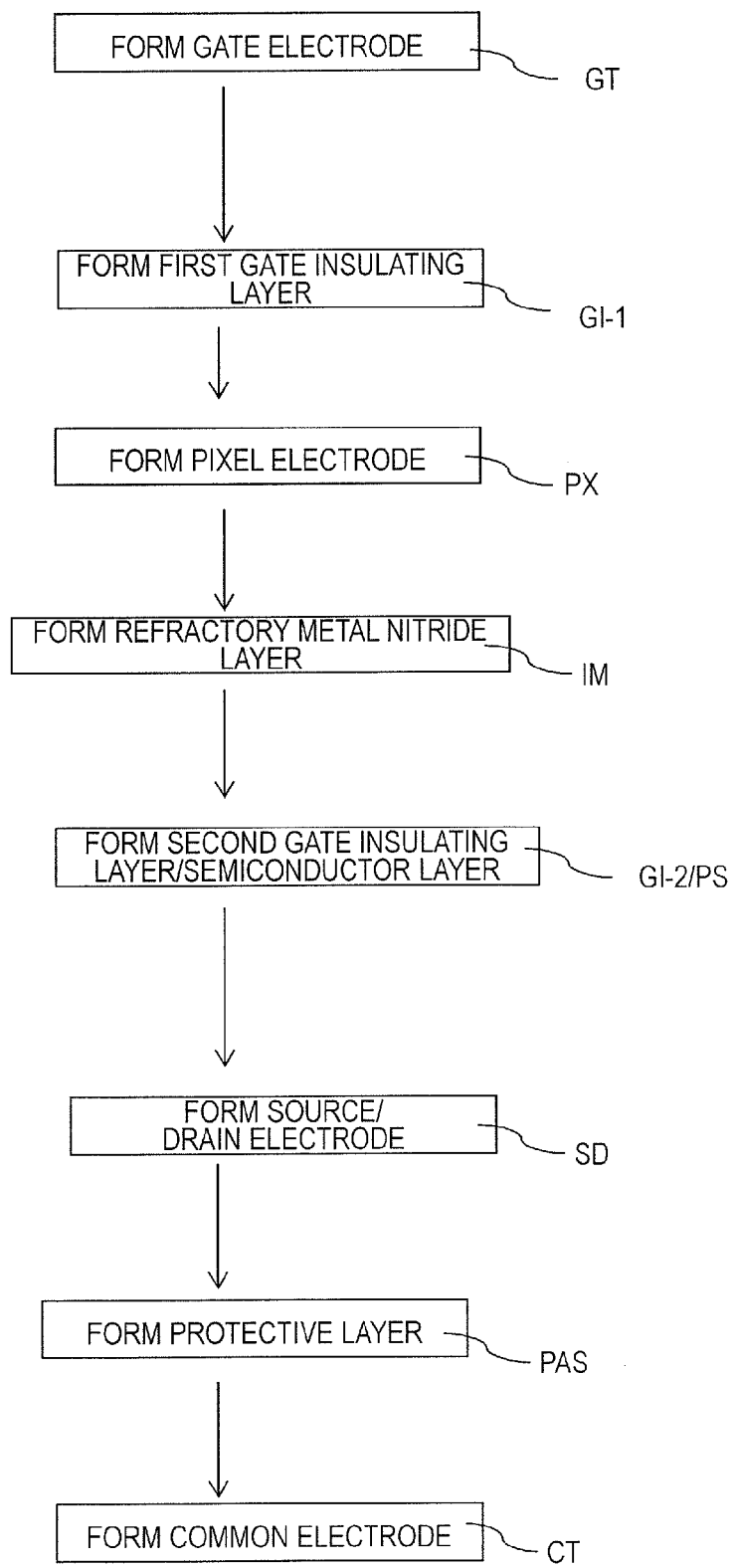
FIG. 15 A block diagram illustrating how the TFT substrate 100E may be fabricated.

FIG. 15 is a block diagram illustrating how the TFT substrate 100E may be fabricated. FIGS. 16(*a*) through 16(*h*) are schematic cross-sectional views illustrating how the TFT substrate 100E may be fabricated and corresponding to FIG. 14(*a*).

As shown in FIG. 15, the manufacturing process of the TFT substrate 100E includes a gate electrode forming process step GT, a first gate insulating layer forming process step GI-1, a pixel electrode forming process step PX, a refractory metal nitride layer forming process step IM, a second gate layer/semiconductor layer forming process step GI-2/PS, a source/drain electrode forming process step SD, a protective layer forming process step PAS and a common electrode forming process step CT. And the manufacturing process advances in this order.

Figure 16:
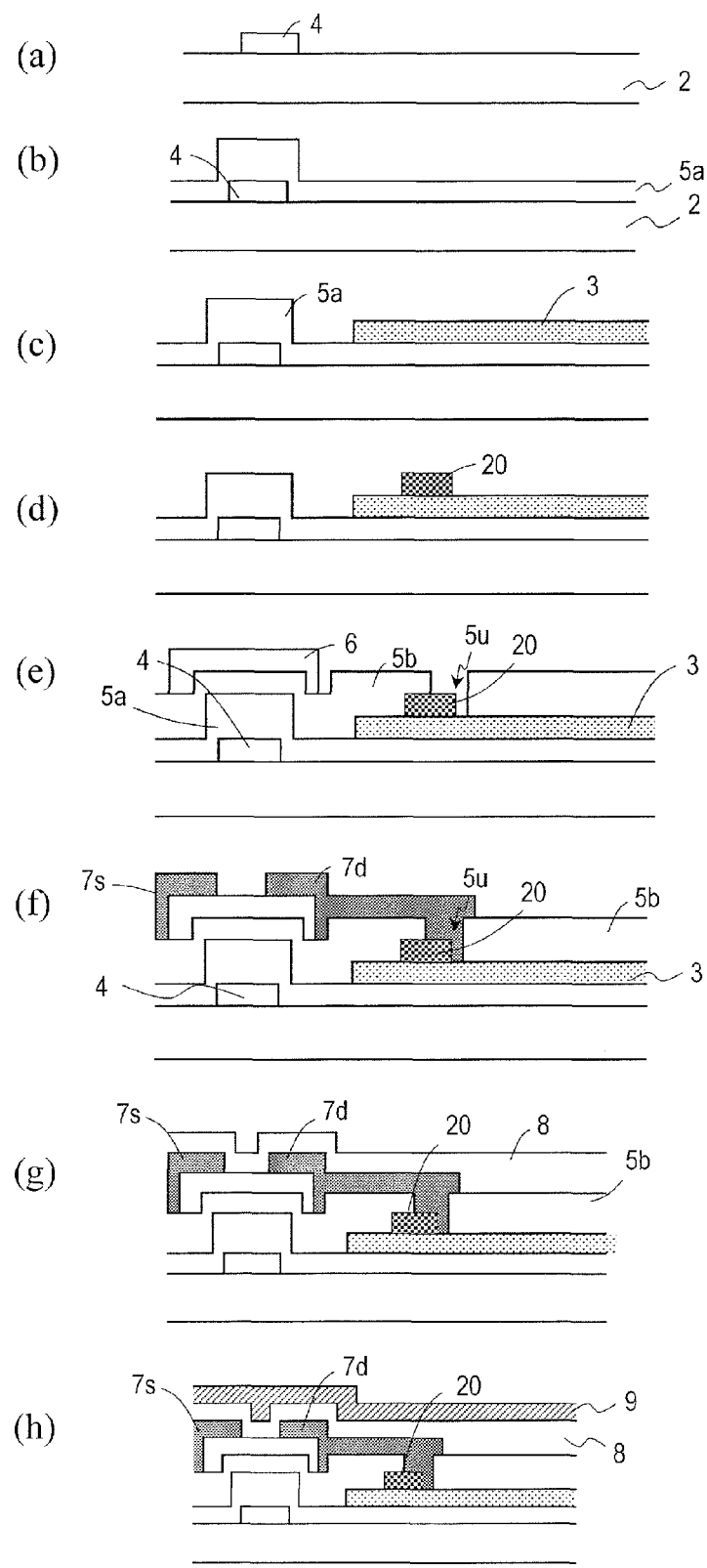
FIG. 16 (a) through (h) are schematic cross-sectional views illustrating how the TFT substrate 100E may be fabricated.

First of all, as shown in FIG. 16(*a*), a gate electrode 4 is formed in the gate electrode forming process step GT as already described with reference to FIG. 3(*c*).

Next, as shown in FIG. 16(*b*), in the first gate insulating layer forming process step GI-1, an insulating film (not shown) is formed over the gate electrode 4 by CVD process, for example, and then patterned by photolithographic process and wet or dry etching process, thereby forming a first gate insulating layer 5*a*. After the first gate insulating layer 5*a* has been formed by patterning, the resist (not shown) that has been used in the patterning process is stripped.

Subsequently, as shown in FIG. 16(*c*), in the pixel electrode forming process step PX, a pixel electrode 3 is formed on the gate insulating layer 5*a* as already described with reference to FIG. 3(*a*).

Thereafter, as shown in FIG. 16(*d*), in the refractory metal nitride layer forming process step IM, a nitride layer 20 is formed on a portion of the upper surface of the pixel electrode 3 as already described with reference to FIG. 3(*b*).

Then, as shown in FIG. 16(*e*), in the second gate insulating layer/semiconductor layer forming process step GI-2/PS, a second gate insulating layer 5 and a semiconductor layer 6 are formed over the first gate insulating layer 5*a* and the pixel electrode 3. The second gate insulating layer 5 and semiconductor layer 6 may be formed in the same way as the insulating layer 5 and semiconductor layer 6 as already described with reference to FIG. 3(*d*).

Next, by performing the source/drain electrode forming process step SD, the protective layer forming process step PAS and the common electrode forming process step CT shown in FIGS. 16(*f*) to 16(*h*), source and drain electrodes 7*s*, 7*d*, a protective layer 8 and a common electrode 9 are formed. These members may be formed as already described with reference to FIGS. 3(*e*) through 3(*g*). In this manner, the TFT substrate 100E is completed.

If an electrode layer is formed out of polycrystalline ITO as the pixel electrode 3, wet etching is suitably adopted to form the nitride layer 20 and source and drain electrodes by patterning after the pixel electrode 3 has been formed in the process described above. In that case, it is possible to prevent the characteristic of the upper surface of the pixel electrode 3 from deteriorating due to dry etching to cause a decrease in the degree of close contact or an increase in contact resistance.

Embodiment 6

A sixth embodiment of a semiconductor device according to the present invention will now be described. The semiconductor device of this embodiment is a TFT substrate for use in a display device.

Figure 17:
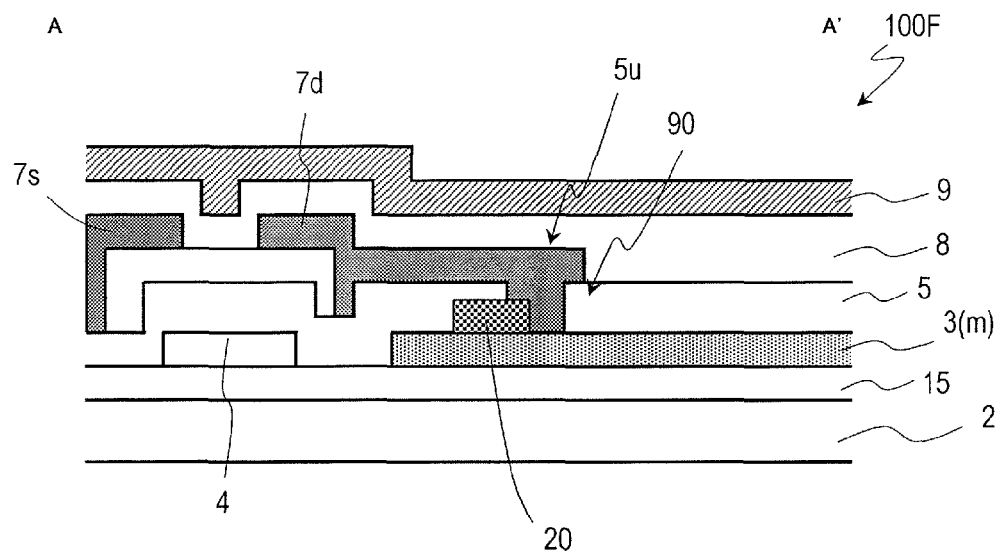
FIGS. 17 (a) and (b) are schematic cross-sectional views of a TFT substrate 100F according to a sixth embodiment of the present invention, wherein (a) and (b) illustrate cross sections as respectively viewed on the planes A-A' and B-B' shown in FIG. 1(a).
Figure 17:
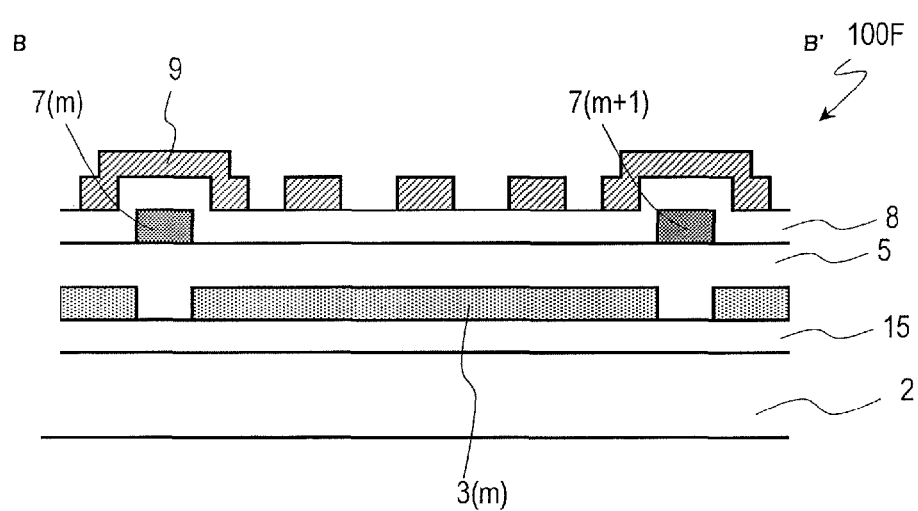

FIGS. 17(*a*) and 17(*b*) are schematic cross-sectional views illustrating a TFT substrate 100F according to this embodiment. A plan view of the TFT substrate 100F and an enlarged plan view of the contact portion are just as shown in FIGS. 1(*a*) and 1(*d*). FIGS. 17(*a*) and 17(*b*) illustrate cross-sectional structures as respectively viewed on the planes A-A' and B-B' shown in FIG. 1(*a*). In FIGS. 17(*a*) and 17(*b*), any component also included in the TFT substrate 100A shown in FIG. 1 and having substantially the same function as its counterpart is identified by the same reference numeral as its counterpart's and description thereof will be omitted herein to avoid redundancies.

In this TFT substrate 100F, an undercoat insulating layer (buffer layer) 15 is formed on the substrate 2 and a gate electrode 4 and a pixel electrode 3 are formed on the undercoat insulating layer 15, which is a major difference from the TFT substrate 100A.

According to this embodiment, the same effects as the ones achieved by the TFT substrate 100A of the first embodiment can also be achieved. In addition, depending on the metallic material that makes the gate electrode 4, the degree of contact between the gate electrode 4 and the substrate 2 may be low in some cases. However, by providing the undercoat insulating layer 15 on the substrate 2, the degree of close contact of the gate electrode 4 can be increased. On top of that, since the undercoat insulating layer 15 functions as a protective layer for the substrate 2, the substrate 2 may also be an alkali glass substrate or any other substrate which may produce ion elution. Alternatively, the substrate 2 may also be a plastic substrate made of an acrylic resin, for example, or a film base made of PET, for example. Thus, since the substrate 2 may be made of various materials other than non-alkali glass, the substrate 2 can be selected from a wider variety of materials.

If plastic or film base with low thermal resistance is used as a material for the substrate 2, an oxide semiconductor layer is suitably used as the semiconductor layer 6. Since an oxide semiconductor can be processed at a lower temperature than an Si-based semiconductor, an oxide semiconductor film can be formed and patterned on plastic or film base. That is why if plastic or film base is used as a material for the substrate 2 and if an undercoat insulating layer 15 is formed on the surface of such a substrate 2 and then an oxide semiconductor TFT is formed thereon, a semiconductor device which can be used effectively in a flexible display, for example, can be fabricated.

The undercoat insulating layer 15 may be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the undercoat insulating layer 15 may fall within the range of about 50 nm to about 600 nm, for example.

The gate electrode 4 and contact portion 90 do not have to have the configuration shown in FIG. 17. Although the undercoat insulating layer 15 is provided for the TFT substrate 100A (see FIG. 1) in the example shown in FIG. 17, the undercoat insulating layer 15 may also be used in any of the other TFT substrates 100B to 100D.

This TFT substrate 100F can be fabricated in the following manner. First of all, an undercoat insulating layer 15 is formed over the substrate 2 by CVD process, for example (which will be hereinafter referred to as a "buffer layer forming process step BU"). Subsequently, the pixel electrode forming process step PX, gate electrode forming process step GT, refractory metal nitride layer forming process step PX, gate insulating layer/semiconductor layer forming process step GI/PS, source/drain electrode forming process step SD, protective layer forming process step PAS and common electrode forming calculate CT are performed. These process steps to be performed after the undercoat insulating layer 15 has been formed may be the same as the ones that have already been described with reference to FIGS. 3(a) through 3(g).

Embodiment 7

Next, a seventh embodiment of a semiconductor device according to the present invention will be described. In the semiconductor device of this embodiment, no insulating layer is provided between a transparent conductive layer and a metal layer, which is a major difference from the embodiments described above.

The semiconductor device of this embodiment includes a contact portion which connects the transparent conductive layer and the metal layer together. In the contact portion, a refractory metal nitride layer is arranged between the transparent conductive layer and the metal layer and contacts with the upper surface of the transparent conductive layer. Also, when viewed along a normal to the substrate, the refractory metal nitride layer is arranged in a region where the metal layer and the transparent conductive layer overlap with each other, and has a different shape from the metal layer. The metal layer may be either a drain electrode or an electrode layer which is electrically connected to the drain electrode. The transparent conductive layer may be a pixel electrode, for example. The semiconductor device of this embodiment just needs to have a contact portion with such a configuration. And the contact portion does not have to be a contact portion between a TFT and a pixel electrode, but may also be a terminal portion or a connecting portion as well.

The configuration of a semiconductor device according to this embodiment will now be described more specifically on the supposition that the semiconductor device is implemented as a TFT substrate.

Figure 18:
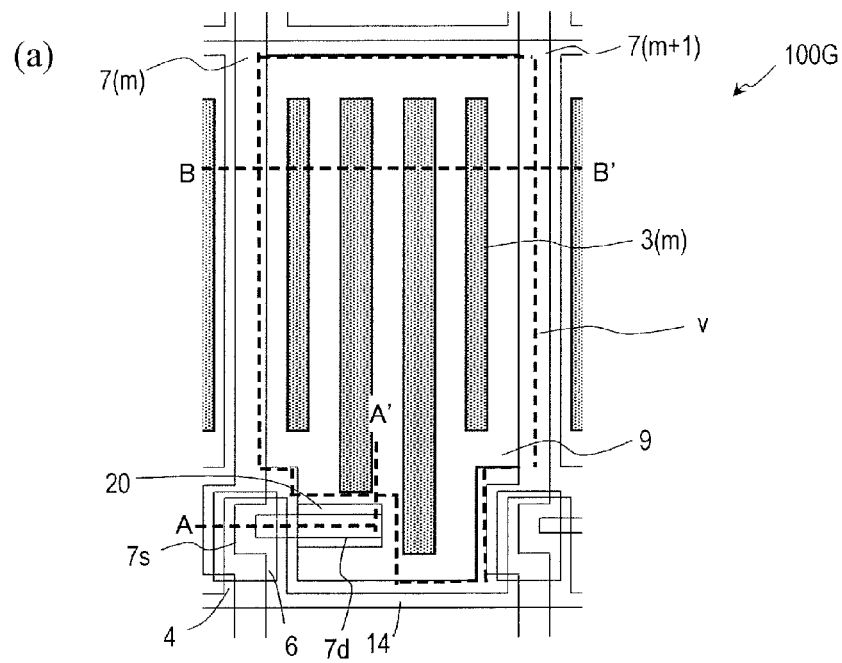
FIG. 18 (a) is a schematic plan view of a TFT substrate 100G according to a seventh embodiment of the present invention. (b) and (c) are schematic cross-sectional views of the TFT substrate 100G as respectively viewed on the planes A-A' and B-B' shown in (a). And (d) is an enlarged cross-sectional view of a contact portion.
Figure 18:
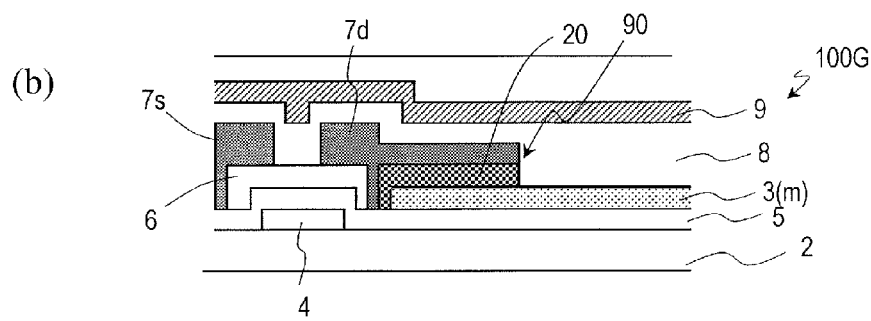
Figure 18:
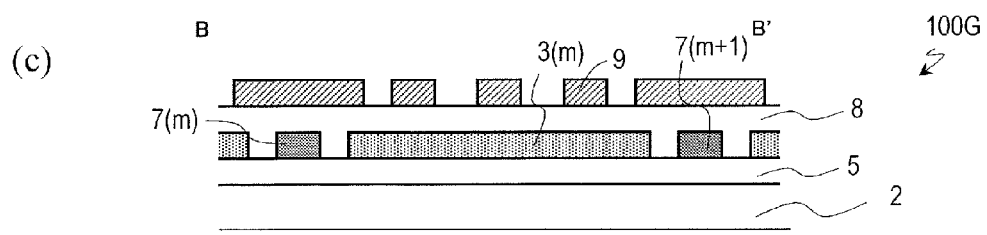
Figure 18:
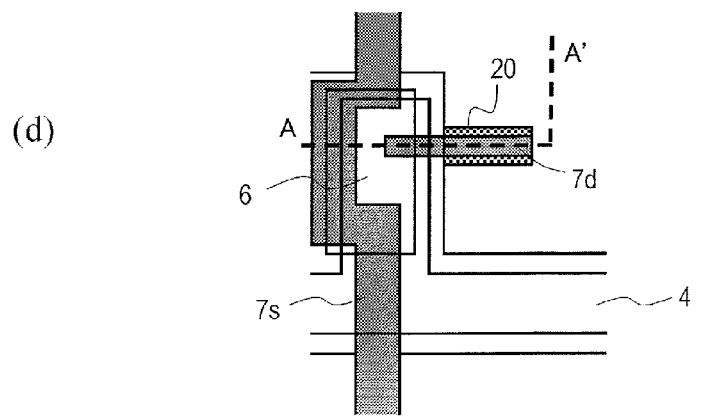

FIG. 18(a) is a schematic plan view of a TFT substrate 100G according to an embodiment of the present invention. FIGS. 18(b) and 18(b) are schematic cross-sectional views of the TFT substrate 100G as respectively viewed on the planes A-A' and B-B' shown in FIG. 18(a). And FIG. 18(d) is an enlarged plan view illustrating a region of the TFT substrate 100G including the contact portion on a larger scale. In FIG. 18, any component also included in the TFT substrate 100A shown in FIG. 1 and having substantially the same function as its counterpart is identified by the same reference numeral as its counterpart's and description thereof will be omitted herein to avoid redundancies.

As shown in FIGS. 18(a) to 18(d), this TFT substrate 100G includes a substrate 2, a gate electrode 4 formed on the substrate 2, an insulating layer 5 covering the gate electrode 4, a pixel electrode (transparent conductive layer) 3 formed on the insulating layer 5, a semiconductor layer 6 overlapping with the gate electrode 4 with the insulating layer 5 interposed between them, and source and drain electrodes (metal layer) 7s, 7d which are electrically connected to the semiconductor layer 6. This TFT substrate 100G further includes a contact portion 90 which electrically connects the drain electrode 7d and the pixel electrode 3 together.

In the contact portion 90, a nitride layer 20 is arranged between the pixel electrode 3 and the drain electrode 7d. The nitride layer 20 contacts with a portion of the upper surface of the pixel electrode 3. Also, when viewed along a normal to the substrate 2, the nitride layer 20 has a different shape from the drain electrode 7d. In this embodiment, the insulating layer 5 is a gate insulating layer, and the pixel electrode 3 and nitride layer 20 are arranged over the insulating layer 5.

The TFT substrate 100G of this embodiment includes the nitride layer 20 between the drain electrode 7d and the pixel electrode 3, and therefore, can not only reduce the resistance between the pixel electrode 3 and the drain electrode 7d to a low level but also increase the degree of close contact between them. In addition, the nitride layer 20 has a different shape from the drain electrode 7d. As can be seen, since the nitride layer 20 and the drain electrode 7d have been patterned separately from each other, the nitride layer 20 can be arranged only in a necessary region and the manufacturing cost can be cut down to a low level.

In the example illustrated in FIG. 18, when viewed along a normal to the substrate 2, the nitride layer 20 is arranged over the entire region where the drain electrode 7d and the pixel electrode 3 overlap with each other. Thus, the upper surface of the pixel electrode 3 does not directly contact with the drain electrode 7d. By adopting such a configuration, a decrease in the degree of close contact and an increase in resistance due to the property of the upper surface of the pixel electrode 3 can be checked even more effectively. For example, as can be seen from FIG. 18(d), by setting the width of the nitride layer 20 to be greater than that of the drain electrode 7d when viewed along a normal to the substrate 2, the configuration described above can be obtained with more certainty.

In the first through sixth embodiments described above, the contact portion is arranged inside a contact hole of the insulating layer, and therefore, the area of contact is limited to the area of the contact hole. On the other hand, in this embodiment, no insulating layers are provided between the drain electrode 7d and the pixel electrode 3, and therefore, the area of contact between the drain electrode 7d and the nitride layer 20 (or between the nitride layer 20 and the pixel electrode 3) in the contact portion can be increased. As a result, the display quality can be further stabilized.

In addition, in the example illustrated in FIG. 18, the width of the nitride layer 20 is set to be greater than that of the drain electrode 7d, and the aperture area of the pixel decreases accordingly. However, according to this embodiment, with as large a contact area as that of the first through sixth embodiments secured, the length of a portion of the drain electrode 7d overlapping with the pixel electrode 3 can be reduced. That is why by reducing the length of the drain electrode 7d, the aperture ratio can still be kept high even if the width of the drain electrode 7d is increased.

Figure 19:
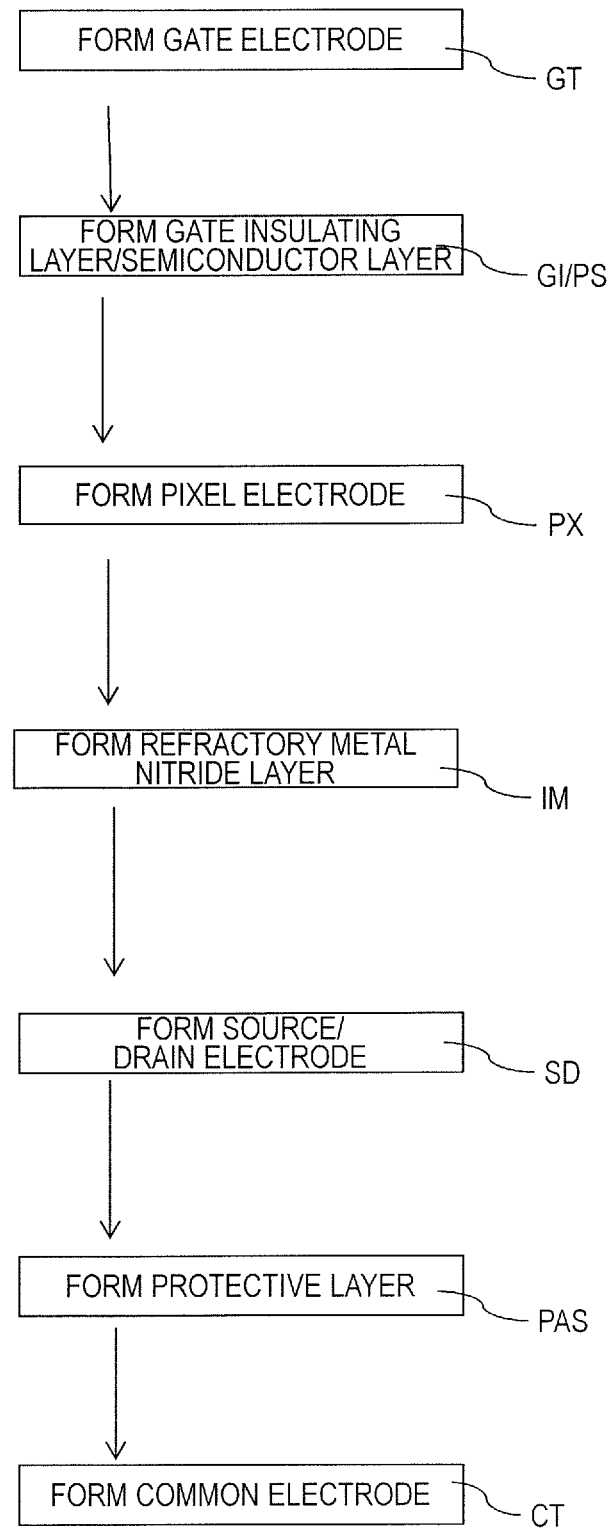
FIG. 19 A block diagram illustrating how the TFT substrate 100G may be fabricated.
Figure 20:
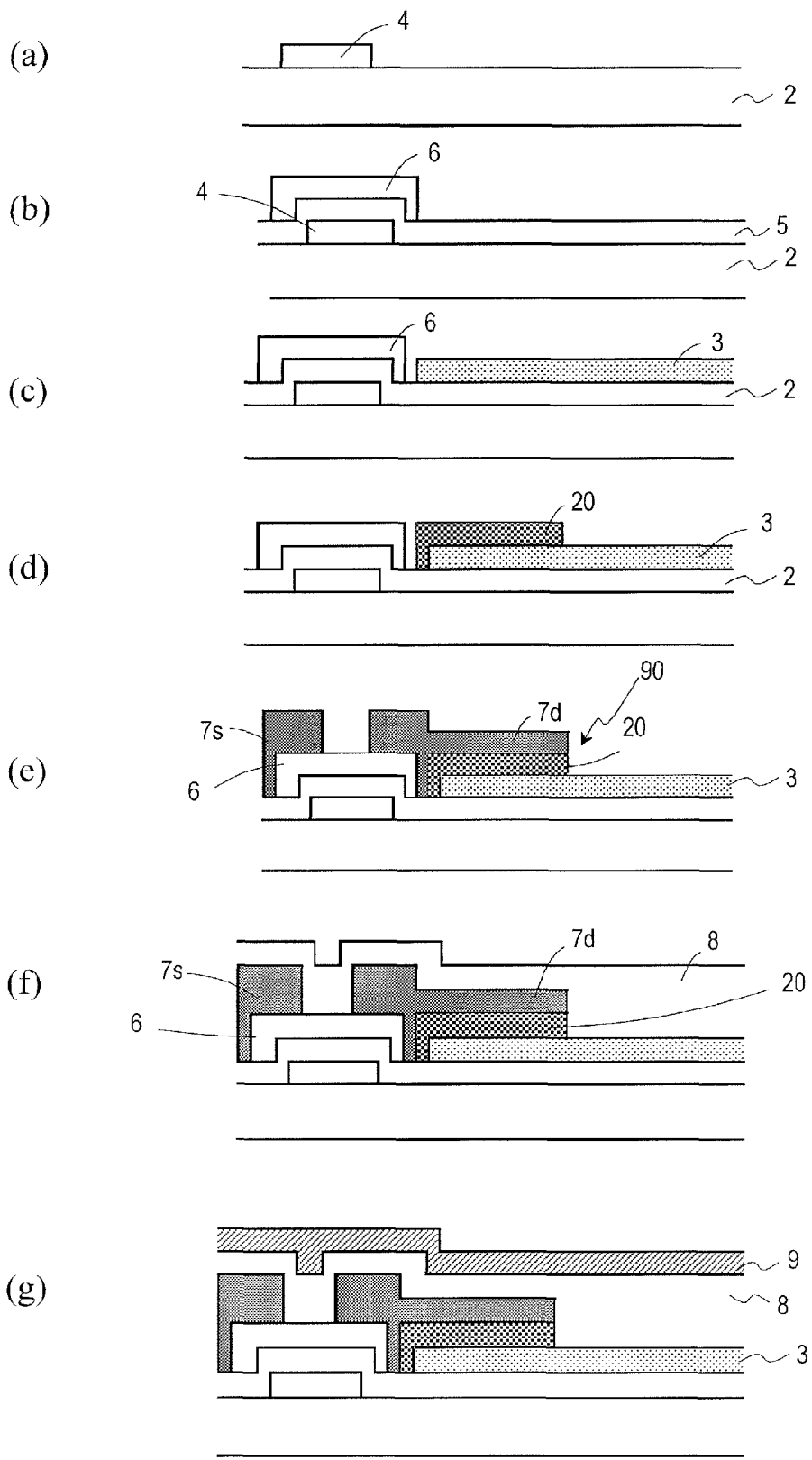
FIG. 20 (a) through (g) are schematic cross-sectional views illustrating how the TFT substrate 100G may be fabricated.

Next, an exemplary method for fabricating this TFT substrate 100G will be described with reference to FIGS. 19 and 20. FIG. 19 is a block diagram illustrating how to fabricate the TFT substrate 100G. FIGS. 20(a) through 20(g) are schematic cross-sectional views illustrating how to fabricate the TFT substrate 100G.

As shown in FIG. 19, the manufacturing process of the TFT substrate 100G includes a gate electrode forming process step GT, a gate insulating layer/semiconductor layer forming process step GI/PS, a pixel electrode forming process step PX, a refractory metal nitride layer forming process step IM, a source/drain electrode forming process step SD, a protective layer forming process step PAS and a common electrode forming process step CT. And the manufacturing process advances in this order.

Specific manufacturing process steps will now be described with reference to FIGS. 20(a) through 20(g), which are cross-sectional views corresponding to the one shown in FIG. 18(b). Also, the respective films are supposed to be formed and patterned just as already described with reference to FIG. 3.

First, as shown in FIG. 20(a), in the gate electrode forming process step GT, a conductive film is deposited over the substrate 2 by sputtering process, for example, and then patterned, thereby forming a gate electrode 4.

Next, as shown in FIG. 20(b), in the gate insulating layer/semiconductor layer forming process step GI/PS, an insulating film (not shown) is deposited over the gate electrode 4 by CVD process, for example. Next, the insulating film is patterned, thereby forming an insulating layer 5. After that, a semiconductor film (not shown) such as an In—Ga—Zn—O based semiconductor film is deposited over the insulating layer 5 by sputtering process, for example, and then patterned, thereby forming a semiconductor layer 6. The semiconductor layer 6 is formed so as to overlap with the gate electrode 4 with the insulating layer 5 interposed between them.

Subsequently, as shown in FIG. 20(c), in the pixel electrode forming process step PX, a conductive film (not shown), which may be a transparent conductive film such as an ITO film, is deposited over the insulating layer 5, and then patterned, thereby forming a pixel electrode 3.

Next, as shown in FIG. 20(d), in the refractory metal nitride layer forming process step IM, a refractory metal nitride film is deposited over the pixel electrode 3 by performing a sputtering process in a nitrogen ambient, for example. And the nitride film is patterned, thereby forming a nitride layer 20 on a portion of the upper surface of the pixel electrode 3.

Then, as shown in FIG. 20(e), in the source/drain electrode forming process step SD, a metal film (not shown) is deposited over the semiconductor layer 6, the insulating layer 5 and the nitride layer 20 by sputtering process, for example. Thereafter, the metal film is patterned by photolithographic and wet etching processes, thereby forming source and drain electrodes 7s and 7d.

The source and drain electrodes 7s, 7d are each electrically connected to the semiconductor layer 6. A portion of the semiconductor layer 6 which contacts with the source electrode 7s becomes a source contact region. A portion of the semiconductor layer 6 which contacts with the drain electrode 7d becomes a drain contact region. And a region of the semiconductor layer 6 interposed between the source and drain contact regions becomes a channel region. The drain electrode 7d is also electrically connected to the pixel electrode 3 via the nitride layer 20. Optionally, the drain electrode 7d may contact with both the nitride layer 20 and the pixel electrode 3. In this manner, a contact portion 90 which connects the drain electrode 7d and the pixel electrode 3 is obtained.

Thereafter, as shown in FIGS. 20(f) and 20(g), the protective layer forming process step PAS and the common electrode forming process step CT are performed, thereby forming a protective layer 8 and a common electrode 9. These members are formed just as already described with reference to FIGS. 3(f) and 3(g), respectively. In this manner, the TFT substrate 100G is completed.

According to this method, the nitride layer 20 is formed after the pixel electrode 3 has been formed and before the source and drain electrodes 7s, 7d are formed, and therefore, the upper surface of the pixel electrode 3 can be protected. Thus, it is possible to prevent the upper surface of the pixel electrode 3 from being altered during the process step of forming the source and drain electrodes or any other process step that follows it. As a result, an increase in the resistance of the contact portion and a decrease in reliability can be checked.

The TFT substrate 100G does not have to be fabricated by the method described above. For example, the pixel electrode forming process step PX and refractory metal nitride layer forming process step IM of the process described above may be performed simultaneously.

FIGS. 21(a) through 21(e) are cross-sectional views illustrating another exemplary manufacturing process of the TFT substrate 100G including a process step PX/IM in which the pixel electrode and refractory metal nitride layer are formed simultaneously.

First of all, a gate electrode 4 and an insulating layer 5 are formed on the substrate 2 just as described above.

Figure 21:
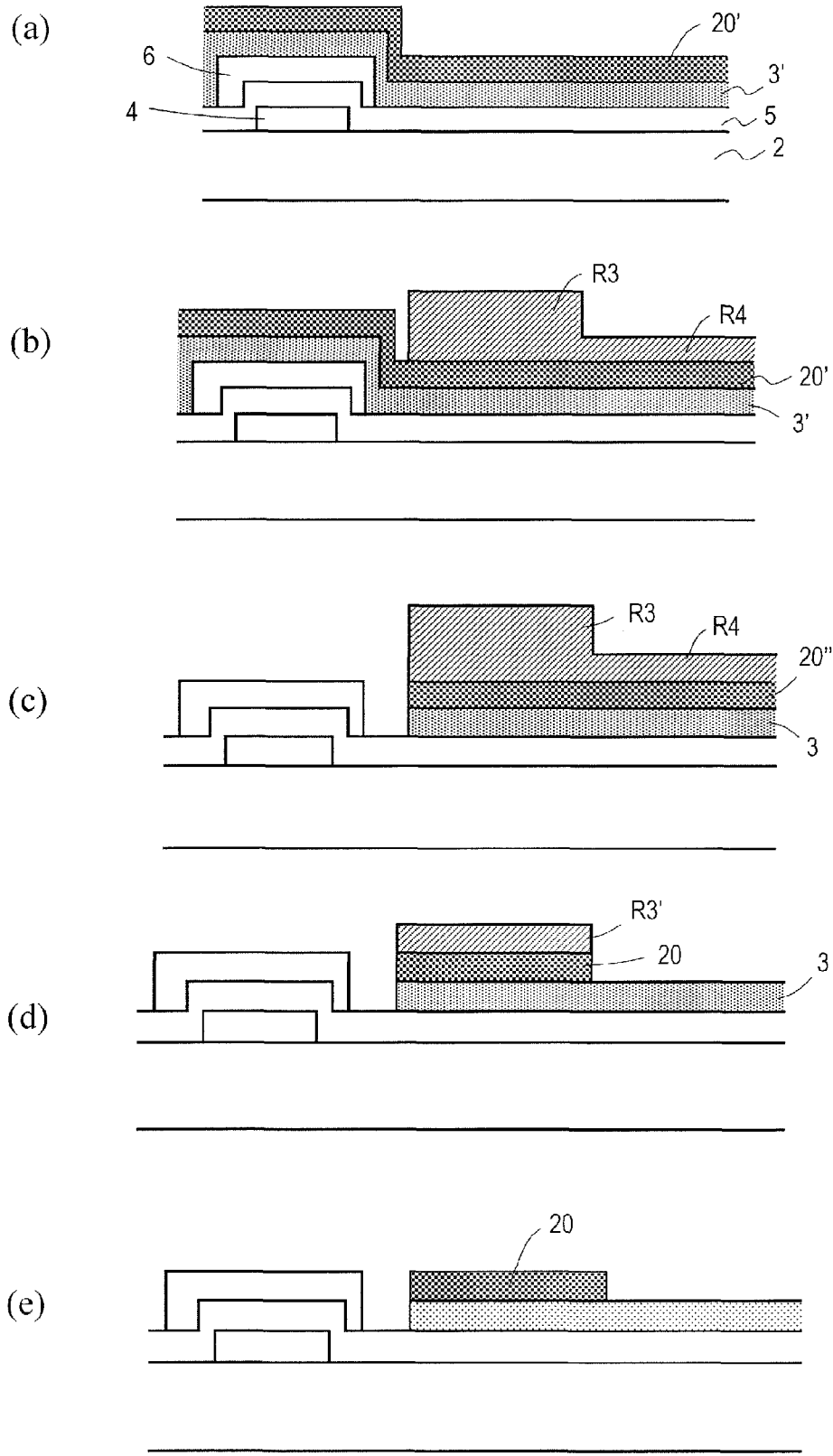
FIG. 21 (a) through (e) are schematic cross-sectional views illustrating how the TFT substrate 100G may be fabricated.

Next, as shown in FIG. 21(a), a transparent conductive film 3' is formed on the insulating layer 5 and then a refractory metal nitride film (metal nitride film) 20' is stacked on the transparent conductive film 3'.

Subsequently, as shown in FIG. 21(b), two resist films R3 and R4 with mutually different thicknesses are formed to have an intended pattern shape on the metal nitride film 20' by half-tone exposure process using a single photomask (which is also called a "half-tone mask"). Specifically, a resist film R3 is formed on a region where a nitride layer is going to be formed, and a resist film R4 which is thinner than the resist film R3 is formed on a region where a pixel electrode is going to be formed (i.e., except the region where the nitride layer is going to be formed).

Subsequently, as shown in FIG. 21(c), portions of the transparent conductive film 3' and metal nitride film 20' which are not covered with the resist films R3 and R4 are patterned by wet etching process. As a result of this patterning process, a pixel electrode 3 is formed out of the transparent conductive film 3' and a nitride layer 20 is formed out of the metal nitride film 20'.

Next, as shown in FIG. 21(d), the resist film R4 is removed by dry etching process. As a result of this dry etching process, the resist film R3 is partially removed to turn into a resist film R3' which is thinner than the resist film R3. After that, the resist film R3' is removed by a known method as shown in FIG. 21(e).

Thereafter, the source/drain electrode forming process step SD, protective layer forming process step PAS and common electrode forming process step CT are performed as already described with reference to FIGS. 3(e) through 3(g), thereby completing the TFT substrate 100G shown in FIG. 18.

If a half-tone exposure process is adopted as in the method described above, the pixel electrode 3 and nitride layer 20 can be formed with a single photomask. As a result, the number of photomasks to use, and eventually the overall manufacturing cost, can be cut down.

In the first through sixth embodiments described above, an insulating layer 5 is formed between the nitride layer 20 and the drain electrode 7d, and a contact portion 90 is formed inside a contact hole of the insulating layer 5. In this seventh embodiment, on the other hand, no insulating layers are provided between the nitride layer 20 and the drain electrode 7d. As described above, according to this seventh embodiment, the areas of contact between the drain electrode 7d and the nitride layer 20 and between the nitride layer 20 and the pixel electrode 3 can be increased in the contact portion 90, which is beneficial. On the other hand, if the contact portion 90 is formed inside the contact hole of the insulating layer 5 as in the first through sixth embodiments, the aperture ratio of each pixel can be further increased. The reason will be described below with reference to the accompanying drawings.

According to the configuration in which no insulating layers are provided between the nitride layer 20 and the drain electrode 7a (i.e., according to the seventh embodiment), source lines 7(m), 7(m+1) and a pixel electrode 3(m) are formed on the insulating layer 5 as shown in FIG. 18(d). The pixel electrode 3(m) is arranged between the two adjacent source lines 7(m) and 7(m+1). In this case, the distances between the pixel electrode 3 and the source lines 7(m) and 7(m+1) are each set to be 5 µm or more. The reason is that if the interval between the pixel electrode 3 and the source line 7 were too short (e.g., less than 5 µm), then short-circuit could be produced between them.

On the other hand, according to the configuration in which an insulating layer 5 is provided between the nitride layer 20 and the drain electrode 7d (i.e., according to the first through sixth embodiments), the source lines 7(m) and 7(m+1) are arranged in a different layer from the pixel electrode 3 as shown in FIG. 1(d). That is why even if the interval between the pixel electrode 3 and the source line 7 were less than 5 µm, for example, and if the pixel electrode 3 and source line 7 were arranged so as to overlap with each other by about 1 µm at maximum, when viewed along a normal to the substrate 2, chances of causing short-circuit between them are slim. Consequently, the distance between the source line 7(m), 7(m+1) and the pixel electrode 3 can be shortened, or the source line 7(m), 7(m+1) and the pixel electrode 3 can be arranged to overlap with each other, when viewed along a normal to the substrate 2.

To the contrary, the gate line 14 and the pixel electrode 3 are arranged in two different layers according to the configuration shown in FIG. 18 but are arranged in the same layer according to the configuration shown in FIG. 1. That is why by adopting the configuration shown in FIG. 18, the distance between the gate line 14 and the pixel electrode 3 can be shortened. Generally speaking, a single pixel of a liquid crystal display device is longer in the direction parallel to the direction in which the source lines 7(m) and 7(m+1) run (i.e., in the column direction) than in the direction perpendicular to the column direction (i.e., in the row direction). For example, the length in the column direction: the length in the row direction=3:1. That is why shortening the distance between the source line 7(m), 7(m+1) and the pixel electrode 3 will contribute to increasing the effective aperture area v of each pixel more effectively than shortening the distance between the gate line 14 and the pixel electrode 3(m), 3(m+1). For that reason, by adopting the configuration shown in FIG. 1(d) in which the insulating layer 5 is arranged between the nitride layer 20 and the drain electrode 7d, the aperture ratio of each pixel can be increased more effectively.

An embodiment of a semiconductor device according to the present invention just needs to include a contact portion including a transparent conductive layer, a metal layer arranged over the transparent conductive layer, and a nitride layer arranged between them, and does not have to be implemented as the TFT substrate described above but may also be applied to any of various other kinds of semiconductor devices. Likewise, the manufacturing process and the materials and thicknesses of the respective components described above are just an example, too. Furthermore, the structure of the TFT does not have to be the exemplary one described above, either. For example, if an oxide semiconductor TFT is formed, an etch stop layer may be provided to contact with the channel region. By lowering the resistance of an oxide semiconductor film locally, the oxide semiconductor layer and the pixel electrode can be formed out of the same oxide semiconductor film. Even so, if a nitride layer is formed between the pixel electrode (transparent oxide layer) and the drain electrode so as to contact with the upper surface of the pixel electrode, the effect of checking an increase in the resistance of the contact portion and a decrease in the degree of close contact can also be achieved.

The TFT substrates 100A to 100G of the embodiments described above are applicable to a display device operating in any mode other than the FFS mode. For example, the TFT substrates may also be applied to a display device to be driven with a vertical electric field such as a VA (vertical alignment) mode display device. In that case, the common electrode 9 may be omitted. Alternatively, the common electrode 9 may be replaced with a transparent conductive layer which faces the pixel electrode 3 and which functions as a storage capacitor electrode, and a transparent storage capacitor may be formed within a pixel.

INDUSTRIAL APPLICABILITY

Embodiments of the present invention are applicable broadly to various types of semiconductor devices including a contact portion to connect a transparent conductive layer and a metal layer together. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 2 substrate
3, 3(m), 3(m+1) pixel electrode (transparent conductive layer)
4 gate electrode
5 insulating layer
5u hole
6 semiconductor layer
7s source electrode
7d drain electrode (metal layer)
7(m), 7(m+1) source line
8 protective layer
9 common electrode
14 gate line
15 undercoat insulating layer
19 slit
20 nitride layer
100A to 100G semiconductor device (TFT substrate)

The invention claimed is:
1. A semiconductor device comprising:
a substrate;
a transparent conductive layer supported by the substrate;
an insulating layer which is formed to cover the transparent conductive layer and which has a hole that overlaps at least partially with the transparent conductive layer;
a metal layer formed on the insulating layer and inside the hole; and
a contact portion connecting the transparent conductive layer and the metal layer together,
wherein in the contact portion, a refractory metal nitride layer is arranged between the transparent conductive layer and a portion of the metal layer which is located inside the hole, and the refractory metal nitride layer is in contact with the upper surface of the transparent conductive layer.

2. The semiconductor device of claim 1, wherein when viewed along a normal to the substrate, the refractory metal nitride layer and the metal layer have mutually different shapes.

3. The semiconductor device of claim 1, wherein the refractory metal nitride layer is in contact with the portion of the metal layer that is located inside the hole.

4. The semiconductor device of claim 1, further comprising a thin-film transistor supported by the substrate,
wherein the thin-film transistor includes a semiconductor layer with a channel region, a gate electrode, a gate insulating layer formed between the gate electrode and the semiconductor layer, and source and drain electrodes electrically connected to the semiconductor layer,
the metal layer is either the drain electrode of the thin-film transistor or an electrode layer electrically connected to the drain electrode,
the insulating layer includes the gate insulating layer, and
the transparent conductive layer functions as a pixel electrode.

5. The semiconductor device of claim 4, wherein the gate electrode includes a first gate layer formed out of the same metal nitride film as the refractory metal nitride layer.

6. The semiconductor device of claim 5, wherein the gate electrode further includes a second gate layer which is arranged on the first gate layer and which is made of a different material from the first gate layer.

7. The semiconductor device of claim 6, further comprising, between the refractory metal nitride layer and the metal layer, a conductive layer formed out of the same conductive film as the second gate layer.

8. The semiconductor device of claim 4, further comprising another insulating layer between: the gate electrode; and the transparent conductive layer and the insulating layer.

9. The semiconductor device of claim 4, comprising an undercoat insulating layer between: the substrate; and the gate electrode and the transparent conductive layer.

10. The semiconductor device of claim 1, wherein at least a portion of the upper surface of the nitride layer is in contact with the insulating layer.

11. The semiconductor device of claim 4, further comprising:
a protective layer formed over the source and drain electrodes; and
a common electrode arranged to overlap at least partially with the transparent conductive layer with the protective layer interposed between them.

12. The semiconductor device of claim 4, wherein the semiconductor layer is an oxide semiconductor layer.

13. The semiconductor device of claim 12, wherein the oxide semiconductor layer includes In, Ga and Zn.

14. A method for fabricating the semiconductor device of claim 4,
wherein after the transparent conductive layer has been formed on the substrate and before the gate electrode and the insulating layer are formed, the nitride layer is formed.

15. The semiconductor device of claim 13, wherein the oxide semiconductor layer has crystallinity.

* * * * *